United States Patent
Wu et al.

(10) Patent No.: US 10,284,146 B2
(45) Date of Patent: May 7, 2019

(54) AMPLIFIER DIE WITH ELONGATED SIDE PADS, AND AMPLIFIER MODULES THAT INCORPORATE SUCH AMPLIFIER DIE

(71) Applicant: NXP USA, Inc., Austin, TX (US)

(72) Inventors: Yu-Ting Wu, Schaumburg, IL (US); Nick Yang, Wilmette, IL (US); Joseph Gerard Schultz, Wheaton, IL (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/366,550

(22) Filed: Dec. 1, 2016

(65) Prior Publication Data

US 2018/0159479 A1 Jun. 7, 2018

(51) Int. Cl.
*H03F 3/68* (2006.01)
*H03F 1/02* (2006.01)
(Continued)

(52) U.S. Cl.
CPC ......... *H03F 1/0288* (2013.01); *H01L 23/538* (2013.01); *H01L 23/66* (2013.01); *H01L 24/06* (2013.01); *H01L 24/46* (2013.01); *H01L 24/49* (2013.01); *H03F 3/189* (2013.01); *H03F 3/195* (2013.01); *H03F 3/211* (2013.01); *H03F 3/24* (2013.01); *H01L 2223/6611* (2013.01); *H01L 2223/6644* (2013.01);
(Continued)

(58) Field of Classification Search
CPC ........ H03F 1/0288; H03F 3/211; H03F 3/195; H03F 2203/21106; H03F 2203/21103; H01L 24/06; H01L 23/66; H01L 24/46; H01L 2224/04042; H01L 2223/6611

USPC ..................... 330/295, 125 R, 307
See application file for complete search history.

(56) References Cited

U.S. PATENT DOCUMENTS 5,973,567 A   10/1999   Heal et al.
6,424,223 B1   7/2002   Wang et al.
(Continued)

FOREIGN PATENT DOCUMENTS

JP     6026062 B1    11/2016
WO   2006/016299 A1   2/2006

OTHER PUBLICATIONS

Qureshi, J. H. "A wide-band 20W LMOS Doherty power amplifier", IEEE MTT-S International Microwave Symposium Digest, pp. 1504-1507 (May 2010).
(Continued)

*Primary Examiner* — Khanh V Nguyen
*Assistant Examiner* — Khiem D Nguyen
(74) *Attorney, Agent, or Firm* — Sherry W. Schumm

(57) ABSTRACT

An embodiment of a Doherty amplifier module includes a substrate, a first amplifier die, and a second amplifier die. The first amplifier die includes one or more first power transistors configured to amplify, along a first signal path, a first input RF signal to produce an amplified first RF signal. The second amplifier die includes one or more second power transistors configured to amplify, along a second signal path, a second input RF signal to produce an amplified second RF signal. The first and second amplifier die each also include an elongated output pad that is configured to enable a pluralities of wirebonds to be connected in parallel along the length of the elongated output pad so that the pluralities of wirebonds extend in perpendicular directions to the first and second signal paths.

28 Claims, 5 Drawing Sheets

(51) Int. Cl.
*H03F 3/195* (2006.01)
*H03F 3/21* (2006.01)
*H01L 23/66* (2006.01)
*H01L 23/00* (2006.01)
*H01L 23/538* (2006.01)
*H03F 3/189* (2006.01)
*H03F 3/24* (2006.01)

(52) U.S. Cl.
CPC ............... *H01L 2223/6683* (2013.01); *H01L 2224/04042* (2013.01); *H01L 2224/4917* (2013.01); *H01L 2224/49176* (2013.01); *H03F 2200/114* (2013.01); *H03F 2200/222* (2013.01); *H03F 2200/318* (2013.01); *H03F 2200/387* (2013.01); *H03F 2200/432* (2013.01); *H03F 2200/451* (2013.01); *H03F 2203/21103* (2013.01); *H03F 2203/21106* (2013.01)

(56) References Cited

U.S. PATENT DOCUMENTS

| | | | |
|---|---|---|---|
| 6,833,761 | B2 | 12/2004 | Staudinger et al. |
| 7,078,976 | B2 | 7/2006 | Blednov |
| 7,255,573 | B2 | 8/2007 | He et al. |
| 8,487,703 | B2 | 7/2013 | Blednov |
| 8,653,889 | B1 | 2/2014 | Acimovic et al. |
| 8,717,099 | B2 | 5/2014 | Wilson et al. |
| 8,717,102 | B2 | 5/2014 | Wilson et al. |
| 9,621,115 | B1 | 4/2017 | Wu |
| 2011/0204980 | A1 | 8/2011 | Blednov |
| 2014/0145791 | A1 | 5/2014 | Svechtarov |
| 2015/0119107 | A1 | 4/2015 | Bouny |
| 2015/0372425 | A1 | 12/2015 | Fazelpour et al. |
| 2016/0087586 | A1 | 3/2016 | Szymanowski et al. |
| 2016/0181992 | A1* | 6/2016 | Holmes ............ H03F 1/0288 330/295 |
| 2018/0159479 | A1 | 6/2018 | Wu et al. |

OTHER PUBLICATIONS

Sutono, A. et a. "High-Q LTCC-based passive library for wireless system-on-package (SOP) module development", IEEE Transactions on Microwave Theory and Techniques, vol. 49, No. 10, pp. 1715-1724 (Oct. 2001).

Wood J. et al. "An Extrinsic Component Parameter Extraction Method for High Power RF LDMOS Transistors", IEEE MTT-S International Microwave Symposium Digest, pp. 607-610 (Jun. 2008).

Notice of Allowance and Fees dated Jun. 13, 2008 for U.S. Appl. No. 15/379,789, 9 pgs.

Non Final Office Action; U.S. Appl. No. 15/379,789; 9pages (dated Jan. 12, 2018).

Notice of Allowance; U.S. Appl. No. 15/379,789; 10 pages (dated Dec. 18, 2018).

Notice of Allowance dated Aug. 3, 2018 for U.S. Appl. No. 15/379,789 8 pgs.

Non-Final Office Action dated Oct. 5, 2018 for U.S. Appl. No. 15/846,162, 14 pgs.

* cited by examiner

US 10,284,146 B2

AMPLIFIER DIE WITH ELONGATED SIDE PADS, AND AMPLIFIER MODULES THAT INCORPORATE SUCH AMPLIFIER DIE

TECHNICAL FIELD

Embodiments of the subject matter described herein relate generally to radio frequency (RF) amplifiers, and more particularly to RF amplifier dies and multi-path RF amplifier modules.

BACKGROUND

Wireless communication systems employ power amplifiers for increasing the power of radio frequency (RF) signals. In a wireless communication system, a power amplifier forms a portion of the last amplification stage in a transmission chain before provision of the amplified signal to an antenna for radiation over the air interface. High gain, high linearity, stability, and a high level of power-added efficiency are characteristics of a desirable amplifier in such a wireless communication system.

In general, a power amplifier operates at maximum power efficiency when the power amplifier transmits close to saturated power. However, power efficiency tends to worsen as output power decreases. Recently, the Doherty amplifier architecture has been the focus of attention not only for base stations but also for mobile terminals because of the architecture's high power-added efficiency over a wide power dynamic range.

The high efficiency of the Doherty architecture makes the architecture desirable for current and next-generation wireless systems. However, the architecture presents challenges in terms of semiconductor package design. Current Doherty amplifier semiconductor package designs call for the use of discrete devices, conductors, and integrated circuits to implement each amplification path. For example, the carrier and peaking amplification paths each may include a distinct power transistor IC die, along with distinct inductance and capacitance components. These distinct power transistor IC dies and components are maintained a distance apart in a typical device package in order to limit potential performance degradation that may occur due to signal coupling between the carrier and peaking amplifiers. More specifically, undesirable signal coupling between the carrier and peaking amplifiers may involve the transfer of energy between components of the carrier and peaking amplifier paths through magnetic and/or electric fields associated with the signals carried on those amplifier paths.

Unfortunately, the desire to maintain a significant spatial distance between amplifier paths in a device package in order to reduce coupling between the paths limits the potential for miniaturization of the semiconductor package. Limiting miniaturization is undesirable where low cost, a low weight, and a small volume and small PCB real estate are important package attributes for various applications.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
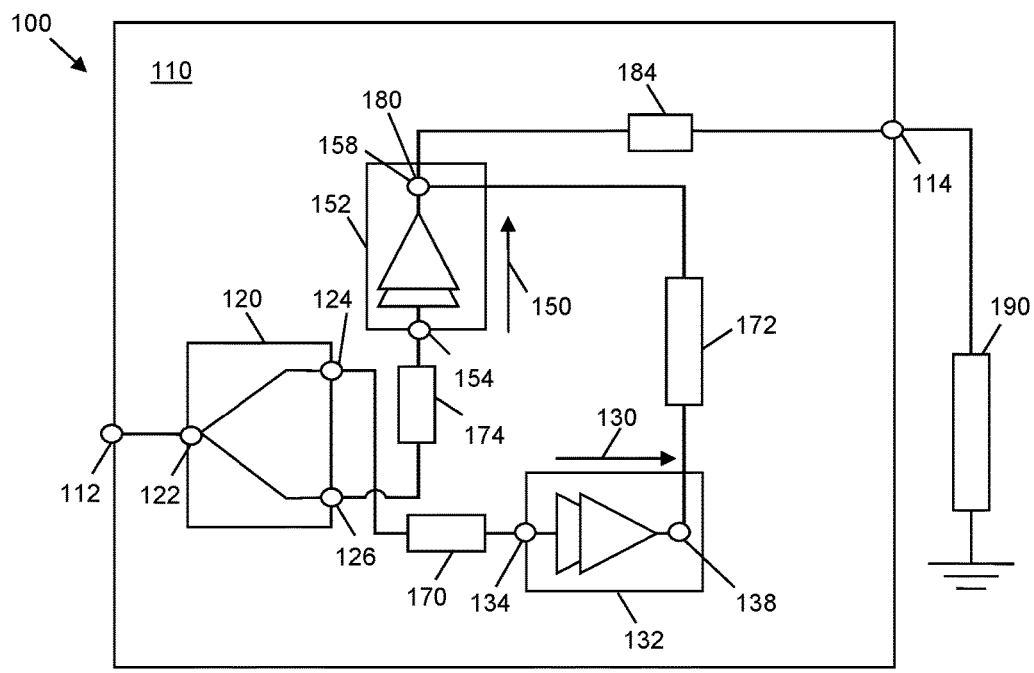
FIG. 1 is a schematic diagram of a Doherty amplifier, in accordance with an example embodiment.

A typical two-way Doherty amplifier implementation includes an RF signal splitter configured to divide an input RF signal into two signals (referred to as a carrier signal and a peaking signal herein). The amplifier also includes parallel carrier and peaking amplifier paths configured to amplify the carrier and peaking signals, respectively, and a signal combiner configured to combine the amplified carrier and peaking signals. In addition, various phase shift elements are disposed along the carrier and peaking amplifier paths. For example, in a typical non-inverted Doherty amplifier architecture, a 90 degree phase shift is applied to the peaking signal prior to amplification along the peaking amplifier path, and a corresponding 90 degree phase shift is applied to the carrier signal after amplification along the carrier amplifier path, and before the amplified carrier and peaking signals are combined together in phase. Conversely, in a typical inverted Doherty amplifier architecture, a 90 degree phase shift is applied to the carrier signal prior to amplification along the carrier amplifier path, and a 90 degree phase shift is applied to the peaking signal after amplification along the peaking amplifier path, and before the amplified carrier and peaking signals are combined together in phase.

Miniaturization efforts for Doherty amplifiers and other types of multiple-path RF amplifiers are geometrically restricted when conventional carrier and peaking amplifier die (i.e., power transistor die) are utilized. In a conventional power transistor die, an input terminal (e.g., a gate terminal) that receives an input RF signal and an output terminal (e.g., a drain terminal) that conveys an amplified output RF signal are elongated conductive structures that are oriented in parallel with each other. Such a die configuration necessitates the use of an input-side wirebond array (coupled to the input terminal) and an output-side wirebond array (coupled to the output terminal) that also are oriented in parallel with each other. With these restrictions, options for placing the various phase shift elements and other amplifier components are limited. Accordingly, efforts to minimize the footprint size of an amplifier layout that uses conventional die is at least partially constrained by the conventional die configurations.

In addition, in a conventional multiple-path amplifier, coupling between signal paths can adversely affect amplifier performance. Coupling can be of two types, including electric coupling (commonly referred to as capacitive coupling) and magnetic coupling (commonly referred to as inductive coupling). Inductive and magnetic coupling occurs when a time-varying magnetic field exists between current conducting, parallel conductors that are in close proximity to one another. For example, one type of coupling in a Doherty amplifier power transistor package may occur between arrays of signal wires (e.g., wirebond arrays), which are connected between the various electrical components making up each of the carrier and peaking amplifier paths. The performance of a Doherty amplifier can be adversely affected by coupling between adjacent wirebond arrays. Accordingly, coupling issues have restricted miniaturization efforts for Doherty amplifiers due to minimum spacing requirements between the carrier and peaking amplifier paths.

Embodiments of the inventive subject matter include multiple-path amplifiers, including but not limited to Doherty amplifiers, with one or more RF amplifier die (or power transistor die) that are configured to enable various signal paths to be angularly offset from each other (e.g., perpendicular to each other). According to an embodiment, a power transistor die includes an output terminal (e.g., a transistor drain terminal) that is configured to support connections to multiple angularly offset (e.g., perpendicular) wirebond arrays, and/or connections to one or more wirebond arrays that extend in a direction that is angularly offset from (e.g., perpendicular to) the direction of an input signal. For example, according to an embodiment, at least one elongated portion of an output terminal is oriented in a direction that is angularly offset from (e.g., perpendicular to) the direction in which an elongated input terminal is oriented. By using output terminals that are configured to accept connection to multiple angularly offset wirebond arrays, coupling between such wirebond arrays may be reduced. In addition, embodiments of power transistor die discussed herein enable different, and potentially more compact, amplifier layouts to be designed when compared with designs that are possible using only conventional power transistor die.

In further embodiments, a power transistor die for one signal path (e.g., a carrier path of a Doherty amplifier) and a separate power transistor die for another signal path (e.g., a peaking path of a Doherty amplifier) are arranged in a device package or module in an angularly offset (e.g., perpendicular) manner. This results in an angular offset between the signal paths. By orienting the signal paths in non-parallel orientations, coupling between the carrier and peaking signal paths may be reduced significantly.

FIG. 1 is a schematic diagram of a Doherty amplifier 100, in accordance with an example embodiment. As indicated in FIG. 1 with box 110, some or all components of Doherty amplifier 100 may be implemented in a single device package or module. As will be explained in detail later, and in accordance with various embodiments, the configurations and orientations of the various amplifier components enable the size of the package or module to be significantly reduced, when compared with conventional packaging techniques using conventional components. These miniaturization benefits may be realized while still meeting gain, linearity, stability, and efficiency performance criteria. This is achieved, more specifically, by designing power transistor die that facilitate connection with wirebond arrays that are angularly offset from other wirebond arrays and/or from input signal directions. In addition, the miniaturization benefits may be achieved by orienting the various amplifier components to establish an angular offset between portions of the carrier and peaking amplifier signal paths (e.g., paths 130, 150). The established angular offsets may have the additional beneficial effect of reducing coupling between signals carried along the carrier and peaking paths.

Doherty amplifier 100 includes an RF input node 112, an RF output node 114, a power splitter 120, a carrier amplifier path 130, a peaking amplifier path 150, and a combining node 180, in an embodiment. When incorporated into a larger RF system, the RF input node 112 is coupled to an RF signal source (not illustrated), and the RF output node 114 is coupled to a load 190 (e.g., an antenna or other load). The RF signal source provides an input RF signal, which is an analog signal that includes spectral energy that typically is centered around one or more carrier frequencies. Fundamentally, the Doherty amplifier 100 is configured to amplify the input RF signal, and to produce an amplified RF signal at the RF output node 114.

The power splitter 120 has an input 122 and two outputs 124, 126, in an embodiment. The power splitter input 122 is coupled to the RF input node 112 to receive the input RF signal. The power splitter 120 is configured to divide the RF input signal received at input 122 into first and second RF signals (or carrier and peaking signals), which are provided to the carrier and peaking amplifier paths 130, 150 through outputs 124, 126. According to an embodiment, the power splitter 120 includes a first phase shift element, which is configured to impart a first phase shift (e.g., about a 90 degree phase shift) to the carrier signal before it is provided to output 124. Accordingly, at outputs 124 and 126, the carrier and peaking signals may be about 90 degrees out of phase from each other.

When Doherty amplifier 100 has a symmetrical configuration (i.e., a configuration in which the carrier and peaking amplifier power transistors are substantially identical in size), the power splitter 120 may divide or split the input RF signal received at the input 122 into two signals that are very similar with, in some embodiments, equal power. Conversely, when Doherty amplifier 100 has an asymmetrical configuration (i.e., a configuration in which one of the amplifier power transistors, typically the peaking amplifier transistor, is significantly larger), the power splitter 120 may output signals having unequal power.

In some embodiments, the power splitter 120 may be implemented with fixed-value, passive components. In other embodiments, the power splitter 120 may be implemented with one or more controllable variable attenuators and/or variable phase shifters, which enable the power splitter 120 to attenuate and/or phase shift the carrier and peaking signals based on externally-provided control signals.

Figure 2:
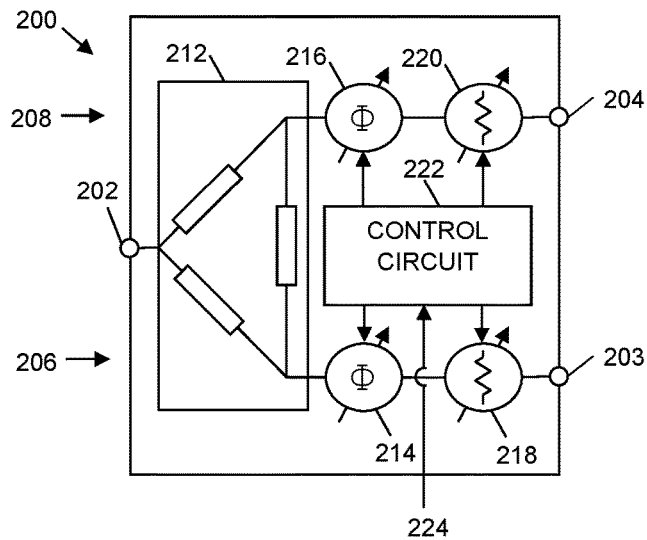
FIG. 2 is a schematic diagram of an RF signal power splitter, in accordance with an example embodiment.

For example, FIG. 2 is a schematic diagram of an RF signal power splitter 200 that may be used as the power splitter 120 in the Doherty amplifier 100 of FIG. 1, in accordance with an example embodiment. The RF power splitter 200 may include, for example, a splitter input terminal 202 (e.g., input 122, FIG. 1), two splitter output terminals 203, 204 (e.g., output terminals 124, 126, FIG. 1), a power divider 212, first and second phase shifters 214, 216, first and second attenuators 218, 220, and a control circuit 222. More specifically, the RF signal power splitter 200 may include a first phase shifter 214 and a first variable attenuator 218 along a first signal path 206, and a second phase shifter 216 and a second variable attenuator 220 along a second signal path 208. Although the phase shifters 214, 216 are shown to precede the variable attenuators 218, 220 along paths 206, 208, the phase shifters 214, 216 and attenuators 218, 220 may be reversed in order, in an alternate embodiment. Further, any one or more of the phase shifters 214, 216 and/or attenuators 218, 220 may be non-variable, or may be excluded from the power splitter 200, in various embodiments. When included, the phase shifter 214 and attenuator 218 in path 206 may be separate circuits from each other, and similarly the phase shifter 216 and attenuator 220 in path 208 may be separate circuits from each other.

The power divider 212 is configured to split the power of an input RF signal received at terminal 202, and to provide the resulting RF signals to first and second power divider outputs that are coupled to the two paths 206, 208. In various embodiments, the power divider 212 may divide the input power equally or non-equally between the paths 206, 208. In addition, according to an embodiment, the power divider 212 may apply the aforementioned first phase shift (e.g., of about 90 degrees) to the portion of the RF signal that is supplied to path 206 or 208, depending on whether the power splitter 200 is being used in a non-inverted or an inverted Doherty amplifier.

According to an embodiment, and during operation, external circuitry may send signals to the control circuit 222 through an interface 224, where the signals indicate desired phase shifts and attenuation levels that the RF signal power splitter 200 should apply to RF signals carried along paths 206, 208. In response to receiving signals indicating desired phase shifts, the control circuit 222 provides control signals to the first and second phase shifters 214, 216. In response, the first and second phase shifters 214, 216 apply corresponding phase shifts to the signals conveyed along the first and second paths 206, 208. It should be noted that the phase shift that may be applied by phase shifter 214 or 216 along path 206 or 208 would be in addition to the approximately 90 degree phase shift applied by the power divider 212. In addition, in response to receiving signals indicating desired attenuation levels, the control circuit 222 provides control signals to the first and second variable attenuators 218, 220. In response, the first and second variable attenuators 218, 220 attenuate the signals conveyed along the first and second paths 206, 208. Ultimately, the phase shifted and/or attenuated RF signals are produced at output terminals 203, 204 (e.g., outputs 124, 126, FIG. 1). Although a phase difference is more than likely to exist between the RF signals produced at output terminals 203, 204, it should be noted that the RF signals have the same frequency as each other since the RF signals produced at output terminals 203, 204 are derived from the same RF input signal.

Referring again to FIG. 1, the outputs 124, 126 of the power splitter 120 are connected to the carrier and peaking amplifier paths 130, 150, respectively. As shown in FIG. 1, the connection between output 126 and the peaking amplifier path 150 crosses over the connection between output 124 and the carrier amplifier path 130. As will be conveyed later in conjunction with the discussion of FIG. 3, this cross-over configuration may enable further compaction and miniaturization of the amplifier 100 by enabling a compact arrangement of input circuits 170, 174. In an alternate embodiment, outputs 124 and 126 may be reversed, enabling the outputs 124 and 126 to be connected to the carrier and peaking paths 130, 150 without one connection crossing over the other connection.

The carrier amplifier path 130 is configured to amplify the carrier signal from the power splitter 120, and to provide the amplified carrier signal to the power combining node 180. Similarly, the peaking amplifier path 150 is configured to amplify the peaking signal from the power splitter 120, and to provide the amplified peaking signal to the power combining node 180, where the paths 130, 150 are designed so that the amplified carrier and peaking signals arrive in phase with each other at the power combining node 180.

According to an embodiment, the carrier amplifier path 130 includes an input circuit 170 (e.g., including an impedance matching circuit), a carrier amplifier die 132, and an impedance inverter element 172. In addition, the carrier amplifier path 130 may include various components associated with an output circuit (e.g., an output impedance matching circuit, not illustrated).

The carrier amplifier die 132 includes an RF input terminal 134, an RF output terminal 138, and one or more amplification stages coupled between the input and output terminals 134, 138, in various embodiments. The RF input terminal 134 is coupled through input circuit 170 to the first output 124 of the power splitter 120, and thus the RF input terminal 134 receives the carrier signal produced by the power splitter 120.

Each amplification stage of the carrier amplifier die 132 includes a power transistor. More specifically, each power transistor includes a control terminal (e.g., a gate terminal) and first and second current-carrying terminals (e.g., a drain terminal and a source terminal). In a single-stage device, which would include a single power transistor, the control terminal is electrically connected to the RF input terminal 134, one of the current-carrying terminals (e.g., the drain terminal or the source terminal) is electrically connected to the RF output terminal 138, and the other current-carrying terminal (e.g., the source terminal or the drain terminal) is electrically connected to a ground reference (or another voltage reference). Conversely, a two-stage device would include two power transistors coupled in series, where a first transistor functions as a driver amplifier transistor that has a relatively low gain, and a second transistor functions as an output amplifier transistor that has a relatively high gain. In such an embodiment, the control terminal of the driver amplifier transistor is electrically connected to the RF input terminal 134, one of the current-carrying terminals of the driver amplifier transistor (e.g., the drain terminal or the source terminal) is electrically connected to the control terminal of the output amplifier transistor, and the other current-carrying terminal of the driver amplifier transistor (e.g., the source terminal or the drain terminal) is electrically connected to the ground reference (or another voltage reference). Additionally, one of the current-carrying terminals of the output amplifier transistor (e.g., the drain terminal or the source terminal) is electrically connected to the RF output terminal 138, and the other current-carrying terminal of the output amplifier transistor (e.g., the source terminal or the drain terminal) is electrically connected to the ground reference (or another voltage reference).

In addition to the power transistor(s), portions of input and output impedance matching networks and bias circuitry (not illustrated in FIG. 1) also may be monolithically formed as portions of the carrier amplifier die 132 and/or electrically coupled to the carrier amplifier die 132. Further, in an embodiment in which the carrier amplifier die 132 is a two-stage device, an interstage matching network (not illustrated in FIG. 1) also may be monolithically formed as a portion of the carrier amplifier die 132.

The RF output terminal 138 of the carrier amplifier die 132 is coupled to the power combining node 180 through impedance inverter element 172, in an embodiment. According to an embodiment, the impedance inverter is a lambda/4 ($\lambda$/4) transmission line phase shift element (e.g., a microstrip line), which imparts about a 90 degree relative phase shift to the carrier signal after amplification by the carrier amplifier die 132. A first end of the impedance inverter element 172 is coupled to the RF output terminal 138 of the carrier amplifier die 132, and a second end of the phase shift element 172 is coupled to the power combining node 180.

As will be explained in more detail in conjunction with FIG. 3, an embodiment of the RF output terminal 138 of the carrier amplifier die 132 is configured to enable the connection between the carrier amplifier die 132 and the first end of the impedance inverter element 172 (e.g., implemented with a wirebond array) to extend in a direction that is angularly offset from (e.g., perpendicular to) the direction of the input signal to the carrier amplifier die 132 (e.g., as indicated with arrow 130). This may be accomplished, for example, by providing an elongated input terminal 134 (e.g., gate terminal) that is angularly offset from (e.g., perpendicular to) an elongated portion of the output terminal 138 (e.g., drain terminal) to which the impedance inverter element 172 is coupled.

Reference is now made to the peaking amplifier path 150, which includes a peaking amplifier die 152 and an input circuit 174 (e.g., including an impedance matching circuit), in an embodiment. In addition, the peaking amplifier path 150 may include various components associated with an output circuit (e.g., an output impedance matching circuit, not illustrated).

The peaking amplifier die 152 includes an RF input terminal 154, an RF output terminal 158, and one or more amplification stages coupled between the input and output terminals 154, 158, in various embodiments. The RF input terminal 154 is coupled to the second output 126 of the power splitter 120, and thus the RF input terminal 154 receives the peaking signal produced by the power splitter 120.

As with the carrier amplifier die 132, each amplification stage of the peaking amplifier die 152 includes a power transistor with a control terminal and first and second current-carrying terminals. The power transistor(s) of the peaking amplifier die 152 may be electrically coupled between the RF input and output terminals 154, 158 in a manner similar to that described above in conjunction with the description of the carrier amplifier die 132. Additional other details discussed with in conjunction with the description of the carrier amplifier die 132 also apply to the peaking amplifier die 152, and those additional details are not reiterated here for brevity.

The RF output terminal 158 of the peaking amplifier die 152 is coupled to the power combining node 180. According to an embodiment, the RF output terminal 158 of the peaking amplifier die 152 and the combining node 180 are implemented with a common element. More specifically, in an embodiment, the RF output terminal 158 of the peaking amplifier die 152 is configured to function both as the combining node 180 and as the output terminal 158 of the peaking amplifier die 152. In addition, the RF output terminal 158 is configured to enable a connection between the second end of the impedance inverter element 172 and the peaking amplifier die 152 (e.g., implemented with a wirebond array) to extend in a direction that is angularly offset from (e.g., perpendicular to) the direction of the input signal to the peaking amplifier die 152 (e.g., as indicated with arrow 150). This may be accomplished, for example, by providing an elongated input terminal 154 (e.g., gate terminal) that is angularly offset from (e.g., perpendicular to) an elongated portion of the output terminal 158 (e.g., drain terminal) to which the phase shift element 172 is coupled.

The amplified carrier and peaking RF signals combine in phase at the combining node 180. The combining node 180 is electrically coupled to the RF output node 114 to provide the amplified and combined RF output signal to the RF output node 114. In an embodiment, an output impedance matching network 184 between the combining node 180 and the RF output node 114 functions to present proper load impedances to each of the carrier and peaking amplifier dies 132, 152. The resulting amplified RF output signal is produced at RF output node 114, to which an output load 190 (e.g., an antenna) is connected.

Amplifier 100 is configured so that the carrier amplifier path 130 provides amplification for relatively low level input signals, and both amplification paths 130, 150 operate in combination to provide amplification for relatively high level input signals. This may be accomplished, for example, by biasing the carrier amplifier die 132 so that the carrier amplifier die 132 operates in a class AB mode, and biasing the peaking amplifier die 152 so that the peaking amplifier die 152 operates in a class C mode.

In the embodiment illustrated in FIG. 1 and described above, a first phase shift element in splitter 120 imparts about 90 degrees of phase shift to the peaking signal prior to amplification, and phase shift element 172 similarly imparts about 90 degrees of phase shift to the amplified carrier signal so that the amplified carrier and peaking signals may combine in phase at the combining node 180. Such an architecture is referred to as a non-inverted Doherty amplifier architecture. In an alternate embodiment, a first phase shift element in splitter 120 may impart about 90 degrees of phase shift to the carrier signal prior to amplification, rather than to the peaking signal, and phase shift element 172 may be included instead at the output of the peaking amplifier. Such an alternate architecture is referred to as an inverted Doherty amplifier architecture. In still other alternate embodiments, other combinations of phase shift elements may be implemented in the carrier and/or peaking paths 130, 150 prior to amplification to achieve about 90 degrees of phase difference between the carrier and peaking signals prior to amplification, and the phase shifts applied to the amplified carrier and peaking signals may be selected accordingly to ensure that the signals combine in phase at combining node 180. For example, phase shifts greater than 90 degrees may be applied along the carrier and peaking paths 130, 150.

According to an embodiment, the physical components of the carrier and peaking paths 130, 150 are oriented, with respect to each other, so that corresponding portions of the carrier and peaking amplification paths 130, 150 extend in directions that are substantially different from each other. As used herein, the term "signal path" refers to the path followed by an RF signal through a circuit. For example, a portion of a first signal path through the carrier amplifier die 132 extends in a first direction (indicated by arrow 130) between the RF input and output terminals 134, 138. Similarly, a portion of a second signal path through the peaking amplifier die 152 extends in a second direction (indicated by arrow 150) between the RF input and output terminals 154, 158, where the first and second directions are substantially different from each other. In the illustrated embodiment, the first and second directions are perpendicular to each other (i.e., angularly separated by 90 degrees). In other embodiments, the first and second directions may be angularly separated by less or more than 90 degrees. For example, the first and second directions may be angularly separated by any angle between 45 degrees and 315 degrees, in other embodiments. As used herein, the term "substantially different," when referring to the angular separation between directions of corresponding portions of the first and second signal paths, means that the angular separation between the path portions is at least +/−45 degrees.

According to an embodiment, the angular separation between directions of the portions of the first and second signal paths that traverse the carrier and peaking amplifier die 132, 152 is achieved by orienting the carrier and peaking amplifier die 132, 152 so that the signal paths between their respective RF input and output terminals 134, 138, 154, 158 are angularly separated. For example, the carrier and peaking amplifier die 132, 152 are oriented perpendicularly, in an embodiment, so that the directions of the portions of the signal paths through the carrier and peaking amplifier die 132, 152 also are perpendicular.

During operation, the angular separation of the signal paths through the carrier and peaking amplifier die 132, 152 may significantly reduce the amount of coupling between those portions of the signal paths, when compared with a system in which the carrier and peaking die and/or carrier and peaking signal paths run parallel with each other. Given this reduction in coupling between the signal paths, the carrier and peaking amplifier die 132, 152 may be positioned closer together than they could be with conventional parallel orientations, while still achieving acceptable performance. Accordingly, implementation of the various embodiments may enable high-performance Doherty amplifiers to be implemented in relatively small packages or modules, when compared with the sizes of packages or systems used to house conventionally-arranged Doherty amplifiers.

An embodiment of a physical implementation of the Doherty amplifier circuit and power transistor die of FIG. 1 now will be described in detail in conjunction with FIGS. 3-6. More specifically, FIG. 3 is a top view of a Doherty amplifier module 300, in accordance with an example embodiment. FIG. 3 should be viewed simultaneously with FIG. 4, which is a cross-sectional, side view of a portion of the module 300 of FIG. 3 along line 4-4. Doherty amplifier module 300 includes a substrate 310, a power splitter 320 (e.g., power splitter 120, 200, FIGS. 1, 2), a carrier amplifier die 332 (e.g., carrier amplifier die 132, FIG. 1), a peaking amplifier die 352 (e.g., peaking amplifier die 152, FIG. 1), a impedance inverter element 372 (e.g., impedance inverter element 172, FIG. 1), and various other circuit elements, which will be discussed in more detail below.

The Doherty amplifier module 300 may be implemented as a land grid array (LGA) module, for example. Accordingly, the substrate 310 has a component mounting surface 312 and a land surface 314. The component mounting surface 312 and the components mounted to that surface 312 optionally may be covered with an encapsulant material 430 (e.g., a plastic encapsulant). In an alternate embodiment, the components could be contained within an air cavity, which is defined by various structures (not illustrated) overlying the mounting surface 312.

According to an embodiment, the substrate 310 is relatively small, which provides for a particularly compact Doherty amplifier. For example, the component mounting surface 312 may have a width (horizontal dimension in FIG. 3) and a length (vertical dimension in FIG. 3) in a range of about 5 millimeters (mm) to about 20 mm, although the width and/or length may be smaller or larger, as well. In a particular embodiment, for example, the component mounting surface may have a width of about 10 mm and a length of about 6 mm.

For example, the substrate 300 may be a multi-layer organic substrate with a plurality of metal layers 410, 411, 412, 413, 414, 415 which are separated by dielectric material. According to an embodiment, the bottom metal layer 410 is utilized to provide externally-accessible, conductive landing pads 316, 317, 318, 319 of the LGA, where the locations of some example landing pads 316-319 are indicated with dashed boxes in FIG. 3. These landing pads 316-319 (among others, not illustrated) enable surface mounting of the Doherty amplifier module 300 onto a separate substrate (not illustrated) that provides electrical connectivity to other portions of an RF system. Although module 300 is depicted as an LGA module, module 300 alternatively may be packaged as a pin grid array module, a quad flat no leads (QFN) module, or another type of package.

One or more other metal layers (e.g., layers 411, 412) of the substrate 310 may be used to convey DC voltages (e.g., DC bias voltages) and to provide a ground reference. Other layers (e.g., layers 413, 414) may be used to convey RF and other signals through the module 300. Additionally, a patterned metal layer 415 may be formed on the mounting surface 312 of the substrate 310. As will be discussed in more detail below, the patterned metal layer 415 may include a plurality of conductive contacts and traces 390-397 on the mounting surface 312, which facilitates electrical connection to die and other components that may be mounted to the mounting surface 312. Conductive vias (e.g., vias 420, 421) provide for electrical connectivity between the metal layers 410-415.

Each of the carrier and peaking amplifier die 332, 352 are monolithic power transistor integrated circuits (ICs) that may produce significant amounts of heat during operation. In addition, each of the carrier and peaking amplifier die 332, 352 also need access to a ground reference. Accordingly, in an embodiment, substrate 310 also includes a plurality of electrically and thermally conductive trenches 480 to which the carrier and peaking amplifier die 332, 352 are coupled (e.g., with solder, brazing material, silver sinter, or other die attach materials). The trenches 480 extend through the substrate thickness in first-die and second-die mounting zones 302, 303 to provide heat sinks and ground reference access to the carrier and peaking amplifier die 332, 352. For example, the conductive trenches 480 may be filled with copper or another thermally and electrically conductive material. In alternate embodiments, the trenches 480 may be replaced with conductive slugs (e.g., copper slugs) or with thermal vias.

Figure 3:
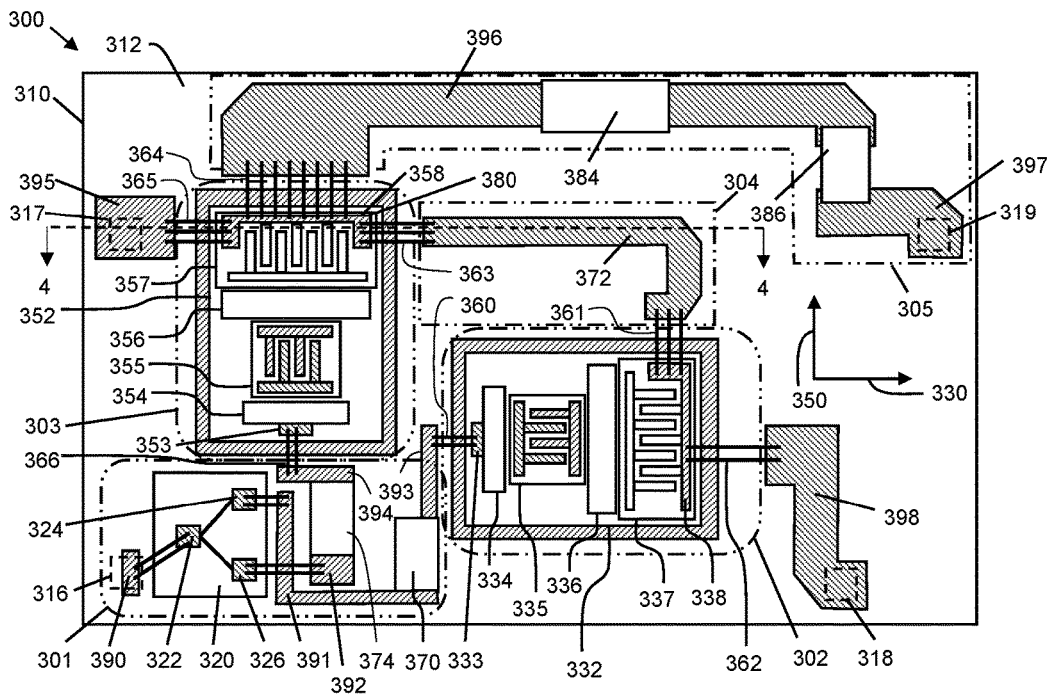
FIG. 3 is a top view of a Doherty amplifier module, in accordance with an example embodiment.
Figure 4:
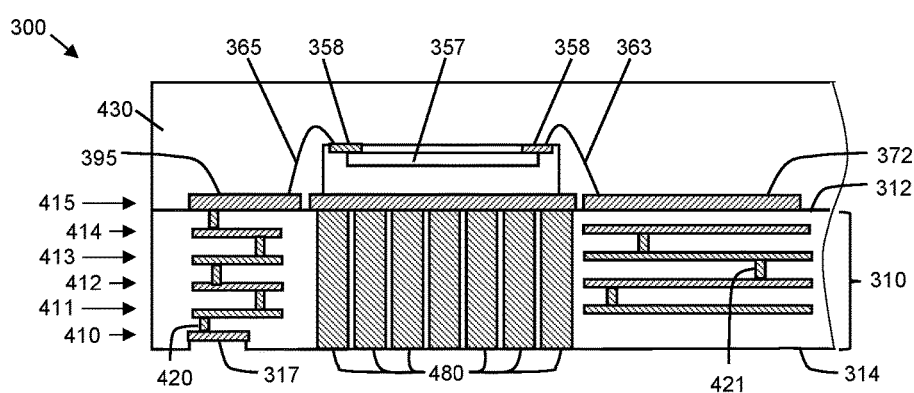
FIG. 4 is a cross-sectional, side view of the module of FIG. 3 along line 4-4.

Referring to the top view of module 300 in FIG. 3, a plurality of non-overlapping zones are defined at the mounting surface 312 of the substrate 310. More specifically, the non-overlapping zones include an input signal and splitter zone 301, a first-die mounting zone 302, a second-die mounting zone 303, an inter-amplifier impedance inverter zone 304, and an output match zone 305. Within the input signal and splitter zone 301, a conductive landing pad 316 exposed at the land surface 314 is electrically coupled through the substrate 310 to a conductive contact 390 at the mounting surface 312. The landing pad 316 and contact 390, along with the electrical connections between them, function as the RF input node (e.g., RF input node 112, FIG. 1) for the module 300.

The power splitter 320 is coupled to the mounting surface 312 in the input signal zone 301. According to an embodiment, the power splitter 320 may include one or more discrete die and/or components, although it is represented in FIG. 3 as a single element. The power splitter includes an input terminal 322 (e.g., input 122, FIG. 1) and two output terminals 324, 326 (e.g., outputs 124, 126, FIG. 1). The input terminal 322 is electrically coupled (e.g., through wirebonds, as shown) to conductive contact 390 to receive an input RF signal. In addition, the output terminals 324, 326 are electrically coupled (e.g., through additional wirebonds, as shown) to conductive contacts 391, 392 at the mounting surface 312. The power splitter 320 is configured to split the power of the input RF signal received through input terminal 322 into first and second RF signals (e.g., carrier and peaking signals), which are produced at the output terminals 324, 326. In addition, the power splitter 320 may include a first phase shift element configured to impart about a 90 degree phase shift to the RF signal provided at output terminal 326. As discussed previously, the power splitter 320 may consist of fixed-value, passive components, or the power splitter 320 may include variable phase shifters and/or attenuators (e.g., as with the power splitter 200, FIG. 2).

The first and second RF signals may have equal or unequal power, as discussed previously. The first RF signal produced at output terminal 324 and conveyed to conductive contact 391 is amplified through a carrier amplifier path, which includes an input circuit 370 (e.g., input circuit 170, FIG. 1) mounted within the input signal zone 301, a carrier amplifier die 332 (e.g., die 132, FIG. 1) mounted within the first-die mounting zone 302, and a impedance inverter element 372 (e.g., impedance inverter element 172, FIG. 1) connected to the substrate 310 within the inter-amplifier impedance inverter zone 304.

The input circuit 370 is electrically connected between conductive contacts 391 and 393. Although the detail is not shown in FIG. 3, the input circuit 370 may include a plurality of discrete and/or integrated components (e.g., inductors and capacitors) configured to provide proper impedance matching between the first power splitter output 324 and the input to the carrier die 332.

Conductive contact 393 is electrically coupled (e.g., with wirebonds 360) to an RF input terminal 333 of the carrier amplifier die 332, in order to provide an RF carrier signal for amplification to the carrier amplifier die 332. The illustrated embodiment of carrier amplifier die 332 embodies a two-stage amplifier, which be described in more detail later in conjunction with FIGS. 5 and 6. A concise description of the carrier amplifier die 332 will be provided now. The electrical components of carrier amplifier die 332 include an RF input terminal 333, an input matching network 334, a driver transistor 335, an interstage matching network 336, an output transistor 337, and an RF output terminal 338. The driver and output transistors 335, 337 are coupled in series between the input and output terminals 333, 338. The driver transistor 335 is configured to apply a relatively low gain to the carrier signal, and the output transistor 337 is configured to apply a relatively high gain to the carrier signal after preliminary amplification by the driver transistor 335. In other embodiments, the carrier amplifier die 332 may embody a single stage amplifier, or may include more than two amplification stages.

Each of the transistors 335, 337 may be a field effect transistor (FET) (such as a metal oxide semiconductor FET (MOSFET), a laterally diffused MOSFET (LDMOS FET), a high electron mobility transistor (HEMT), and so on). Alternatively, each of the transistors 335, 337 may be a bipolar junction transistor (BJT). References herein to a "gate," "drain," and "source," which are commonly used to describe FETs, are not intended to be limiting, as each of these designations has analogous features for BJT implementations.

The input terminal 333 of die 332 is electrically coupled to the gate terminal of transistor 335 through input matching network 334, and the drain terminal of transistor 335 is electrically coupled to the gate terminal of transistor 337 through inter-stage matching network 336. According to an embodiment, the drain terminal of transistor 337 is electrically coupled to output terminal 338. Accordingly, the signal path through the carrier amplifier die 332 is in a direction extending from the first side 501 (FIG. 5) toward the second side 502, or from the RF input terminal 333 toward the RF output terminal 338, which direction is indicated by arrow 330.

An amplified RF carrier signal is produced by the carrier amplifier die 332 at the RF output terminal 338. In an embodiment, the RF output terminal 338 is electrically coupled to phase shift element 372, which is at least partially exposed at the mounting surface 312, with a first wirebond array 361 (i.e., a plurality of parallel, closely spaced wirebonds). In addition, a bias circuit may be electrically coupled to the RF output terminal 338 through conductive trace 398, a second wirebond array 362, and landing pad 318. As will be discussed in detail in conjunction with FIGS. 5 and 6, the RF output terminal 338 of carrier amplifier die 332 includes an elongated first pad (e.g., pad 538, FIG. 5) that is configured to enable wirebonds of the first wirebond array 361 to be connected to the first pad so that the wirebonds extend in a direction that is angularly offset from (e.g., perpendicular to) the direction of the signal path through the carrier amplifier die 332 (e.g., wirebonds 361 may extend in the direction indicated by arrow 350). Further, the RF output terminal 338 may include an elongated second pad (e.g., pad 539, FIG. 5) that is configured to enable the wirebonds of the second wirebond array 362 to be connected to the second pad so that the wirebonds extend in a direction that is substantially parallel to the direction of the signal path through the carrier amplifier die 332 (i.e., wirebonds 362 may extend in the direction indicated by arrow 330).

As mentioned above, through the wirebond array 361, the RF output terminal 338 is electrically coupled to impedance inverter element 372, which is located in the inter-amplifier impedance inverter zone 304. According to an embodiment, impedance inverter element 372 is implemented with a transmission line (e.g., a microstrip line) having an electrical length of about lambda/4 ($\lambda/4$), although the electrical length may be smaller or larger, as well. The transmission line has a first end that is proximate to the carrier amplifier die 332 (and more particularly within a wirebond length of the RF output terminal 338), and a second end that is proximate to the peaking amplifier die 352 (and more particularly within a wirebond length of the RF output terminal 358 of the peaking amplifier die 352). As used herein, "within a wirebond length" means within a distance between about 125 microns and about 200 microns, although the term may mean a smaller or larger distance, as well. According to an embodiment, the impedance inverter element 372 may be formed from a portion of one or more of the metal layers of the module substrate 310 (e.g., one or both of layers 413 and/or 414, FIG. 4), and/or may be formed on a surface of the module substrate 310.

Between RF output terminals 338 and 358, the impedance inverter element 372, together with the wirebond arrays 361, 363, may impart about a 90 degree relative phase shift to the amplified first RF signal produced at the RF output terminal 338. As will be explained in more detail later, RF output terminal 358 of peaking amplifier die 352 may function as a combining node 380 (e.g., combining node 180, FIG. 1) at which the amplified and delayed carrier amplifier signal is combined, in phase, with an amplified peaking amplifier signal.

Moving back to the power splitter 320 in the input signal and splitter zone 301, the second RF signal (i.e., the peaking signal) produced at output terminal 326 of the power splitter 320 and conveyed to conductive contact 392 is amplified through a peaking amplifier path, which includes input circuit 374 within the input signal and splitter zone 301 and a peaking amplifier die 352 (e.g., die 152, FIG. 1) mounted within the second-die mounting zone 303. As mentioned above, the power splitter 320 may impart about a 90 degree phase shift to the RF signal provided at output terminal 326. Accordingly, the phase of the peaking signal received at input terminal 353 of peaking die 352 is delayed by about 90 degrees with respect to the carrier signal received at input terminal 333 of carrier die 332.

The input circuit 374 is electrically connected between conductive contacts 392 and 394. Although the detail is not shown in FIG. 3, the input circuit 374 may include a plurality of discrete and/or integrated components (e.g., inductors and capacitors) configured to provide proper impedance matching between the second power splitter output 326 and the input to the peaking die 352. As shown in FIG. 3, the conductive contacts 391-394 and the input circuits 370, 374 are arranged so that the circuitry within the input signal and splitter zone 301 can be very compact. More specifically, the circuitry is arranged so that the output terminal 326 that produces the peaking signal is farther from the peaking amplifier die 352 than the output terminal 324 that produces the carrier signal. In addition, the conductive path between the output terminal 326 and the RF input terminal 353 of the peaking amplifier die 352 crosses over the conductive path between the output terminal 324 and the RF input terminal 333 of the carrier amplifier die 332 (although a cross-under also could be implemented). This cross-over is accomplished through the wirebonds (not numbered) that electrically couple power splitter output 326 to conductive contact 392. In other embodiments, relatively compact circuitry may be achieved without the cross-over/cross-under configuration shown in FIG. 3. More specifically, the conductive path between the output terminal 326 and the RF input terminal 353 of the peaking amplifier die 352 may be configured so that it does not cross over (or under) the conductive path between the output terminal 324 and the RF input terminal 333 of the carrier amplifier die 332, in other embodiments.

Conductive contact 394 is electrically coupled (e.g., with wirebonds 366) to an RF input terminal 353 of the peaking amplifier die 352, in order to provide an RF carrier signal for amplification to the peaking amplifier die 352. The illustrated embodiment of peaking amplifier die 352 also embodies a two-stage amplifier, which will be described in more detail later in conjunction with FIGS. 7 and 8. A concise description of the peaking amplifier die 352 will be provided now. The electrical components of peaking amplifier die 352 include an RF input terminal 353, an input matching network 354, a driver transistor 355, an interstage matching network 356, an output transistor 357, and an RF output terminal 358. The driver and output transistors 355, 357 are coupled in series between the input and output terminals 353, 358. The driver transistor 355 is configured to apply a relatively low gain to the peaking signal, and the output transistor 357 is configured to apply a relatively high gain to the peaking signal after preliminary amplification by the driver transistor 355. In other embodiments, the peaking amplifier die 352 may embody a single stage amplifier, or may include more than two amplification stages. Again, each of the transistors 355, 357 may be a FET or a BJT.

The input terminal 353 of die 352 is electrically coupled to the gate terminal of transistor 355 through input matching network 354, and the drain terminal of transistor 355 is electrically coupled to the gate terminal of transistor 357 through inter-stage matching network 356. According to an embodiment, the drain terminal of transistor 357 is electrically coupled to output terminal 358. Accordingly, the signal path through the carrier amplifier die 352 is in a direction extending from the first side 701 (FIG. 7) toward the second side 702, or from the RF input terminal 353 toward the RF output terminal 358, which direction is indicated by arrow 350.

An amplified RF peaking signal is produced by the peaking amplifier die 352 at the RF output terminal 358. In an embodiment, and as mentioned above, the RF output terminal 358 is electrically coupled to impedance inverter element 372 with wirebond array 363, and RF output terminal 358 functions as a combining node 380 (e.g., combining node 180, FIG. 1) at which the amplified and delayed carrier amplifier signal is combined, in phase, with an amplified peaking amplifier signal. In addition, a bias circuit may be electrically coupled to the RF output terminal 358 through conductive trace 395, wirebond array 365, and landing pad 317.

As will be discussed in detail in conjunction with FIGS. 7 and 8, the RF output terminal 358 of peaking amplifier die 352 includes an elongated first pad (e.g., pad 738, FIG. 7) that is configured to enable wirebonds of a first wirebond array 363 to be connected to the first pad so that the wirebonds extend in a direction that is angularly offset from (e.g., perpendicular to) the direction of the signal path through the peaking amplifier die 352 (e.g., wirebonds 363 may extend in the direction indicated by arrow 330). Further, the RF output terminal 358 may include an elongated second pad (e.g., pad 739, FIG. 5) that is configured to enable the wirebonds of the second wirebond array 364 to be connected to the second pad so that the wirebonds extend in a direction that is substantially parallel to the direction of the signal path through the carrier amplifier die 352 (i.e., wirebonds 364 may extend in the direction indicated by arrow 350). Further still, the RF output terminal 358 of peaking amplifier die 352 may include an elongated third pad (e.g., pad 740, FIG. 7) that is configured to enable wirebonds of a third wirebond array 365 to be connected to the third pad so that the wirebonds extend in a direction that is angularly offset from (e.g., perpendicular to) the direction of the signal path through the peaking amplifier die 352 (e.g., wirebonds 365 may extend in a direction that is 180 degrees offset from the direction indicated by arrow 330).

The signal path through the peaking amplifier die 352 is in a direction extending from the RF input terminal 353 to the RF output terminal 358, which direction is indicated by arrow 350. As can be seen in FIG. 3, the signal paths through the peaking and carrier amplifier die 352, 332 extend in significantly different directions, and more particularly the signal paths are perpendicular in the embodiment of FIG. 3.

According to an embodiment, except for the configurations of the RF output terminals 338, 358, the peaking amplifier die 352 may be structurally identical to the carrier amplifier die 332, meaning that the two die 332, 352 include the same structural and electrical elements arranged and interconnected in the same manner. According to a further embodiment, the peaking amplifier die 352 and the carrier amplifier die 332 also are identical in size, rendering the Doherty amplifier module 300 a symmetric Doherty amplifier. In an alternate embodiment, the peaking amplifier die 352 and the carrier amplifier die 332 may have different sizes, rendering the Doherty amplifier module 300 an asymmetric Doherty amplifier. For example, the peaking amplifier die 352 may be larger than the carrier amplifier die 332 by a ratio (e.g., 1.6:1, 2:1, or some other ratio).

Either way, each die 332, 352 is rectangular in shape with parallel first and second sides, and parallel third and fourth sides extending between the first and second sides. In each die 332, 352, the RF input terminal 333, 353 is proximate to the first side of the die, and portions of the RF output terminal 338, 358 may be proximate to the second side of the die. The first sides of each die 332, 352 are oriented toward the input signal zone 301, and the first sides of the die 332, 352 are perpendicularly arranged, with respect to each other, in an embodiment. Said another way, the structurally identical carrier and peaking amplifier die 332, 352 are coupled to the mounting surface 312 of the substrate 310 so that the die 332, 352 are perpendicular to each other, rendering the RF signal paths through the die 332, 352 also perpendicular to each other. Even though the die 332, 352 may be positioned relatively close together, their perpendicular orientations may significantly reduce coupling between signals carried through and amplified by the die 332, 352.

As mentioned above, through the wirebond array 363, the RF output terminal 358 is electrically coupled to impedance inverter element 372. Accordingly, the amplified carrier signal produced by the carrier amplifier die 332 is received at the RF output terminal 358 of the peaking amplifier die 352 through impedance inverter element 372 and wirebond array 363. The amplified peaking signal produced by the peaking amplifier die 352 also is received at the RF output terminal 358, and the module 300 is configured so that the amplified carrier and peaking signals arrive and are combined at output terminal 358 (or combining node 380) in phase with each other.

According to an embodiment, the RF output terminal 358 (or combining node 380) is electrically coupled to conductive output trace 396 at the mounting surface 312 with wirebond array 364. As illustrated in FIG. 3, the wirebonds of the wirebond array 364 are aligned in the same direction as the RF signal path through the peaking amplifier die 352 (e.g., in the direction indicated by arrow 350). In an embodiment, wirebond arrays 363, 364 are perpendicularly arranged, with respect to each other. Accordingly, even though the wirebond arrays 363, 364 may be positioned relatively close together, their perpendicular orientations may significantly reduce coupling of RF signals carried through the wirebond arrays 363, 364.

An output impedance matching network 384 and/or a decoupling capacitor 386 may be coupled along output trace 396, in an embodiment. The output impedance matching network 384 functions to present the proper load impedance to combining node 380. Although the detail is not shown in FIG. 3, the output impedance matching network 384 may include various discrete and/or integrated components (e.g., capacitors, inductors, and/or resistors) to provide the desired impedance matching. The output impedance matching network 384 is electrically coupled through the substrate 310 to conductive landing pad 319 exposed at the land surface 314. The landing pad 319 functions as the RF output node (e.g., RF output node 114, FIG. 1) for the module 300.

Besides the bias circuitry connections previously discussed (e.g., including elements 317, 318, 395, 398, 362, 365), module 300 also may include additional bias circuitry and/or bias circuitry connections configured to provide gate and drain bias voltages to some or all of the driver and output transistors 335, 355, 337, 357. For example, the bias circuitry may include, among other things, a plurality of landing pads (at the land surface 314 of the substrate 310), contacts (at the mounting surface 312 of the substrate 310), and other conductive structures and circuitry. Bias voltages provided to the gates and/or drains of the transistors 335, 355, 337, 357 facilitate Doherty operation of the module. For example, the transistors 335, 337 of the carrier amplifier die 332 may be biased to operate in class AB mode, and the transistors 355, 357 of the peaking amplifier die 352 may be biased to operate in class C mode. The above-described configuration corresponds to a non-inverted Doherty amplifier. In an alternate embodiment, modifications could be made to configure the module 300 to function as an inverted Doherty amplifier.

The above described embodiments include two-way Doherty power amplifier implementations, which include a carrier amplifier and one peaking amplifier. According to other embodiments, a Doherty power amplifier may include more than one peaking amplifier, or module 300 may be modified to implement types of amplifiers other than Doherty amplifiers. Said another way, die having RF output terminals 338, 358 configured as shown in FIGS. 3 and 5-8 thus may be utilized in amplifier configurations other than those illustrated and discussed herein.

Various modifications may be made to module 300 without departing from the scope of the inventive subject matter. For example, although substrate 310 is depicted, in FIG. 4, to include five metal layers 410-414, substrates that include more or fewer metal layers alternatively may be used. In addition, other types of substrates alternatively could be used, including ceramic substrates or other types of substrates. Further, alternate embodiments may include a power splitter and/or amplifier die that are configured as flip-chips. Further still, the carrier and peaking amplifier die 332, 352 and/or certain ones of the various sets of wirebond arrays 360-366 may be arranged in non-perpendicular manners, so long as there is a significant angular separation (e.g., an angular separation of 45 degrees or more) between their respective orientations (e.g., between arrays 361 and 362, between arrays 363 and 364, and between arrays 364 and 365). In addition, the carrier and peaking amplifier die 332, 352 may include single stage amplifiers, or two distinct amplifier die (one driver amplifier die and one output amplifier die) may be implemented along each path 330, 350.

Figure 5:
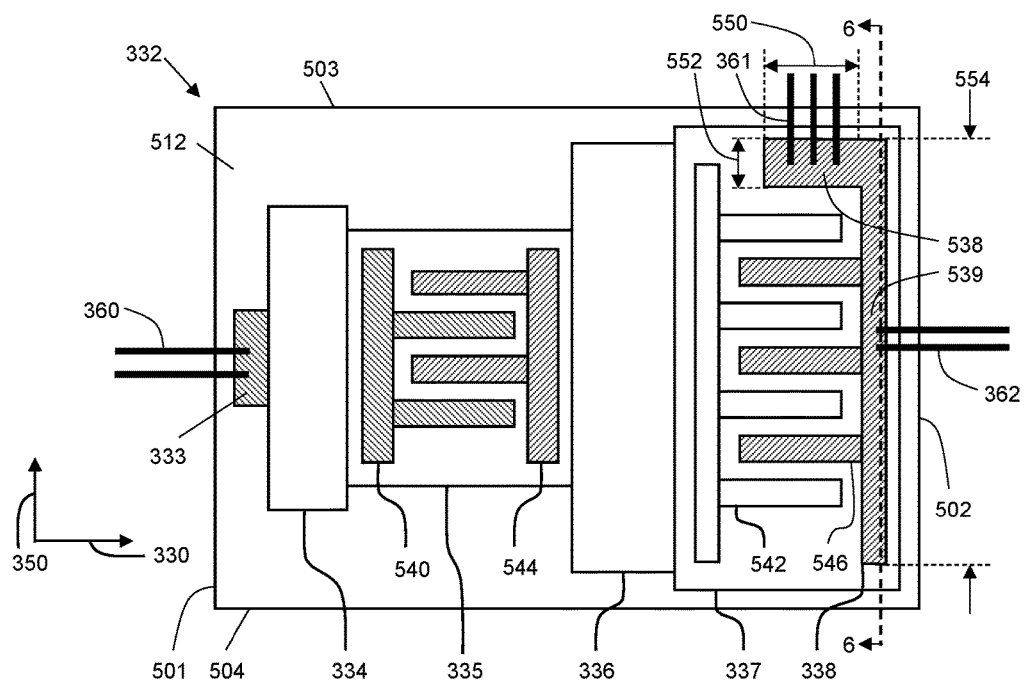
FIGS. 5 and 6 are top and side, cross-sectional views of an RF amplifier die, in accordance with an example embodiment.
Figure 6:
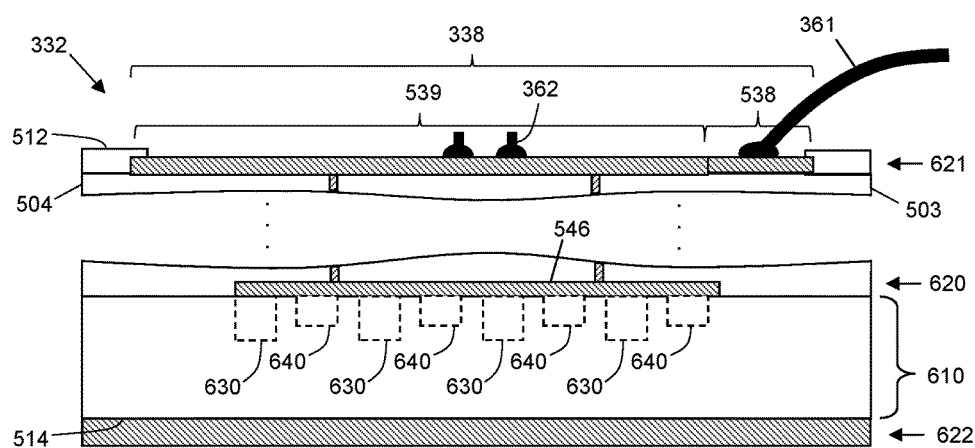

The construction of various embodiments of die 332 will now be discussed in more detail in conjunction with FIGS. 5 and 6, and various embodiments of die 352 will be discussed in more detail later in conjunction with FIGS. 7 and 8. Starting first with die 332, FIG. 5 is an enlarged top view of RF amplifier die 332, and FIG. 6 is a cross-sectional side view of carrier amplifier die 332 along line 6-6 (FIG. 5). Die 332 includes a semiconductor substrate 610 and a plurality of patterned conductive layers 620, 621 (only two shown), separated by dielectric layers, which are formed over a top surface of the semiconductor substrate 610, thus defining top and bottom surfaces 512, 514 of the die 332. An additional conductive layer 622 may be formed on a bottom surface of the semiconductor substrate 610, and the additional layer 622 may function as a ground plane for the die 332. Substrate 610 may be any of various types of semiconductor substrates, such as silicon, silicon-on-insulator (SOI), silicon-on-sapphire (SOS), gallium arsenide (GaAs), gallium nitride (GaN), GaN on silicon carbide, GaN on silicon, or other types of substrate materials. Parallel first and second die sides 501, 502 extend between the top and bottom die surfaces 512, 514, and parallel third and fourth die sides 503, 504 extend between the first and second die sides 501, 502 and between the top and bottom die surfaces 512, 514.

As discussed previously in conjunction with FIG. 3, the electrical components of amplifier die 332 include RF input terminal 333, an input matching network 334, a driver transistor 335, an interstage matching network 336, an output transistor 337, and an RF output terminal 338. According to an embodiment, the RF input terminal 333 is configured to enable an array or plurality of wirebonds 360 to be coupled in parallel with each other to the RF input terminal 333 so that the wirebonds 360 extend in a direction (e.g., direction 330) that is parallel with the direction of the signal path through the carrier amplifier die 332 (e.g., direction 330). More specifically, the RF input terminal 333 includes an elongated, conductive pad 333 that is proximate to the first side 501 of the amplifier die 332, and that has a length that extends in parallel with the first side 501 of the amplifier die 332. According to an embodiment, the length of the pad 333 is large enough to enable a plurality of wirebonds (e.g., from 2 to 10 or more) to be connected in parallel with each other along the length of the pad 333. As shown in FIG. 5, the length of the pad 333 is large enough to enable the plurality of wirebonds 360 to be connected so that they can extend in a perpendicular direction from side 501.

As used herein, a conductive "pad" means a conductive feature of a die that is exposed at a surface of the die, and that is configured to accept direct connection to electrical conductors that are distinct from the die (e.g., wirebonds, solder bonds, and so on). As used herein, the term "proximate to," as it relates to the relative positioning of a pad (e.g., pads 333, 538, 539) with respect to a side (e.g., sides 501-503) may mean that the pad is within 100 microns from the side. In some embodiments, no significant intervening conductive, active, or passive components integrated within the die are positioned between a pad and a side to which it is proximate. In other embodiments, a pad may be considered to be proximate to a side even when there are one or more conductive, active, and/or passive components between the pad and the side. Alternatively, "proximate to," as it relates to the relative positioning of a pad with respect to a side may mean that the pad is within a wirebond length, as previously defined, of the side to which it is proximate.

The driver and output transistors 335, 337 are coupled in series between the input and output terminals 333, 338, where the driver transistor 335 is configured to apply a relatively low gain to the carrier signal, and the output transistor 337 is configured to apply a relatively high gain to the carrier signal after preliminary amplification by the driver transistor 335. In the illustrated embodiment, each of transistors 335, 337 includes interdigitated source and drain "fingers" (i.e., elongated source regions 630 and drain regions 640 in and proximate to the top surface of the substrate 610), with gate terminals 540, 542 (control terminals) overlying the substrate 610 and interdigitated with the source and drain fingers. Each of the gate terminals 540, 542 consists of a set of elongated conductive gate terminal fingers and a common conductive gate bar interconnecting the gate terminal fingers. Drain terminals 544, 546 (current conducting terminals) also overlie the substrate 610 to convey current from the drain regions (i.e., the doped regions 640 at the surface of the semiconductor substrate 610 that together function as drains of the transistors 335, 337). Similar to the gate terminals 540, 542, each drain terminal 544, 546 may consist of a set of elongated conductive drain terminal fingers (interdigitated with the gate terminal fingers) that overlie the substrate 610, along with a common conductive drain bar interconnecting the drain terminal fingers. Although various numbers of gate and drain fingers are illustrated in FIG. 5, a device may include more or fewer fingers, and/or the transistors may have structures other than the interdigitated finger structures discussed herein.

The input terminal 333 of die 332 is electrically coupled to the gate terminal 540 of transistor 335 through input matching network 334, and the drain terminal 544 of transistor 335 is electrically coupled to the gate terminal 542 of transistor 337 through inter-stage matching network 336. According to an embodiment, the drain terminal 546 of transistor 337 is electrically coupled to output terminal 338. Accordingly, the signal path through the carrier amplifier die 332 is in a direction extending from the first side 501 toward the second side 502, or from the RF input terminal 333 toward the RF output terminal 338, which direction is indicated by arrow 330.

According to an embodiment, the RF output terminal 338 is uniquely configured to enable an array or plurality of wirebonds 361 to be coupled in parallel with each other to the RF output terminal 338 so that the wirebonds 361 extend in a direction (e.g., direction 350) that is significantly different from (e.g., perpendicular to) the direction of the signal path through the carrier amplifier die 332 (e.g., direction 330). More specifically, the RF output terminal 338 includes an elongated, conductive side pad 538 that is proximate to the third side 503 of the amplifier die 332, and that has a length 550 that extends in parallel with the third side 503 of the amplifier die 332. According to an embodiment, the length 550 of the side pad 538 is large enough to enable a plurality of wirebonds (e.g., from 2 to 10 or more) to be connected in parallel with each other along the first length of the side pad 538. As shown in FIG. 5, the length 550 of the side pad 538 is large enough to enable the plurality of wirebonds 361 to be connected so that they can extend in a perpendicular direction from side 503.

FIG. 5 shows three wirebonds 361 connected in parallel with each other. In alternate embodiments, the length 550 may be sufficient to enable fewer (e.g., as few as two) or more (e.g., 10 or more) wirebonds to be connected in parallel along the length 550 of the side pad 538. For example, the length 550 may be in a range of about 200 microns to about 400 microns, although the length may be smaller or larger, as well. Side pad 538 also has a width 552 that is sufficient to enable at least one row of wirebonds 361 to be coupled to the side pad 538. For example, the width 552 may be in a range of about 100 microns to about 150 microns, although the width may be smaller or larger, as well.

In addition to the side pad 538, the RF output terminal 338 may include an elongated second pad 539, which is electrically coupled to the elongated side pad 538. The elongated second pad 539 is proximate to the second side 502 of the amplifier die 332, in an embodiment, and the elongated second pad 539 has a length 554 that extends in parallel with the second side 502. According to an embodiment, the side pad 538 and the second pad 539 have lengths 550, 554 that are perpendicular to each other. The length 554 of the second pad 539 is large enough to enable a second plurality of wirebonds 362 to be connected in parallel along the length 554 of the second pad 539. As shown in FIG. 5, the length 554 of the second pad 539 is large enough to enable the plurality of wirebonds 362 to be connected so that they can extend in a perpendicular direction from side 502. FIG. 5 shows two wirebonds 362 connected in parallel with each other. In alternate embodiments, the length 554 may be sufficient to enable more (e.g., 10 or more) wirebonds to be connected in parallel along the length 554 of the second pad 539. According to an embodiment, the length 554 may be in a range of about 800 microns to about 1800 microns, or more desirably in a range of about 800 microns to about 1400 microns, although the length may be smaller or larger, as well.

In an embodiment, the elongated side pad 538 and second pad 539 are integrally formed together as a portion of a same conductive layer 621. In alternate embodiments, the side pad 538 and second pad 539 may be formed from different portions of a single conductive layer, and electrically connected together through conductive vias, portions of other conductive layers, wirebonds, or other types of electrical conductors. Alternatively, the side pad 538 and second pad 539 may be formed from electrically connected portions of multiple conductive layers.

Figure 7:
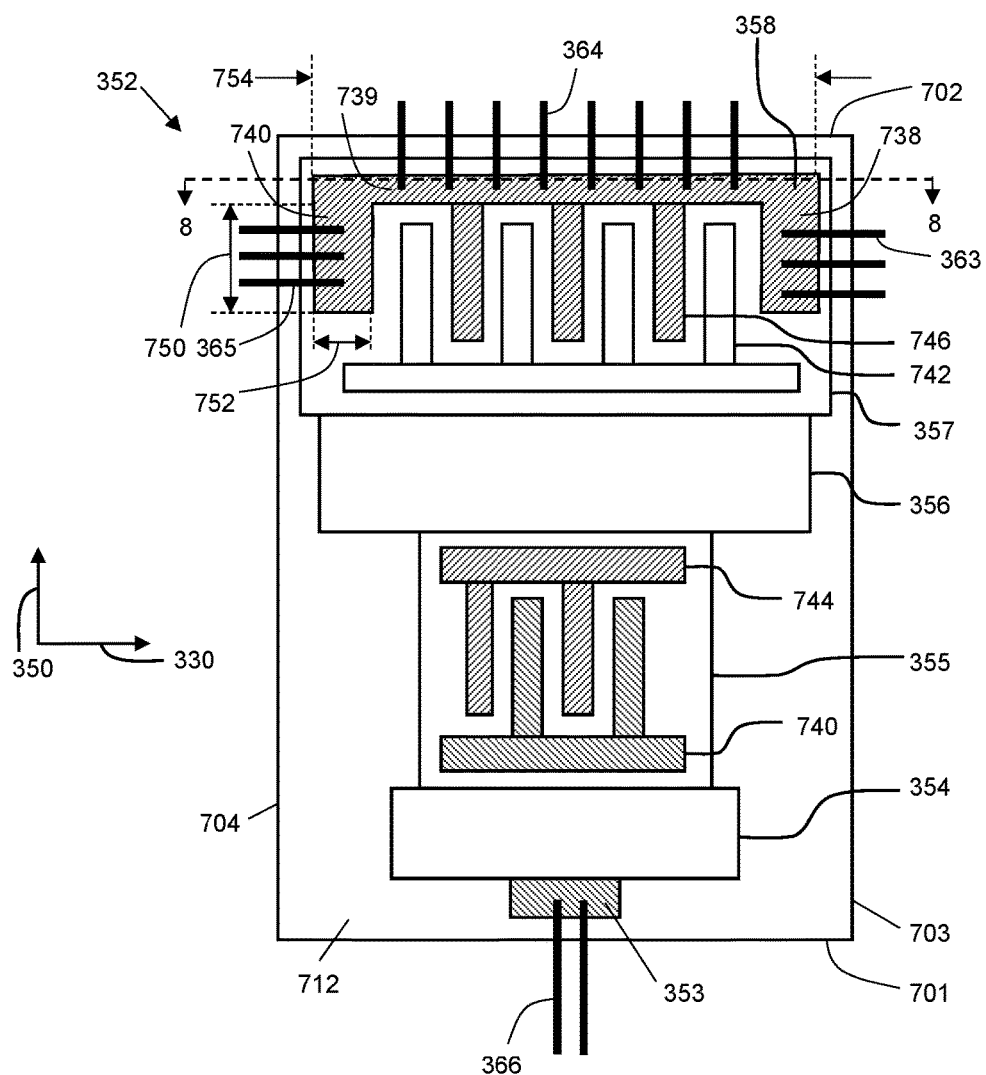
FIGS. 7 and 8 are top and side, cross-sectional views of an RF amplifier die, in accordance with another example embodiment.
Figure 8:
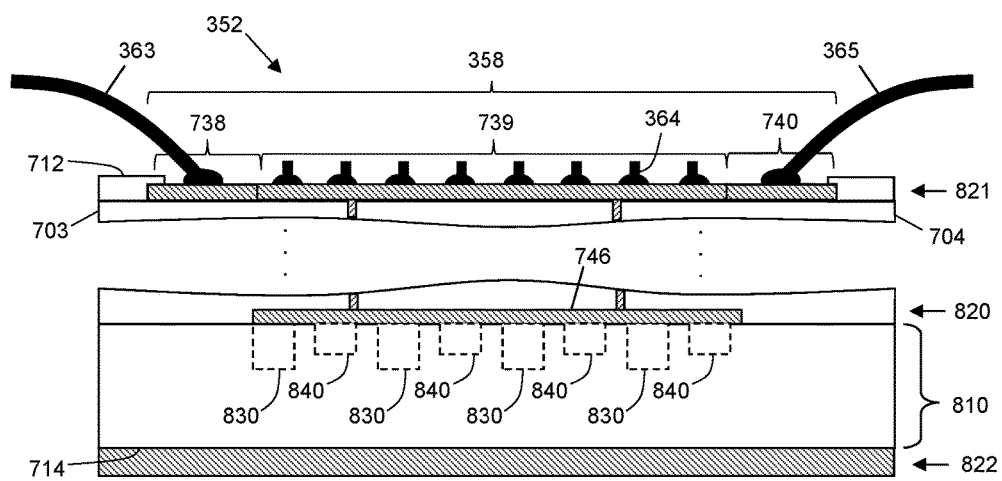

Moving now to die 352, FIG. 7 is an enlarged top view of RF amplifier die 352, and FIG. 8 is a cross-sectional side view of carrier amplifier die 352 along line 8-8 (FIG. 7). Die 352 includes a semiconductor substrate 810 and a plurality of patterned conductive layers 820, 821 (only two shown), separated by dielectric layers, which are formed over a top surface of the semiconductor substrate 810, thus defining top and bottom surfaces 712, 714 of the die 352. An additional conductive layer 822 may be formed on a bottom surface of the semiconductor substrate 810, and the additional layer 822 may function as a ground plane for the die 352. Substrate 810 may be any of various types of semiconductor substrates, such as silicon, SOI, SOS, GaAs, GaN, GaN on silicon carbide, GaN on silicon, or other types of substrate materials. Parallel first and second die sides 701, 702 extend between the top and bottom die surfaces 712, 714, and parallel third and fourth die sides 703, 704 extend between the first and second die sides 701, 702 and between the top and bottom die surfaces 712, 714.

As discussed previously in conjunction with FIG. 3, the electrical components of amplifier die 352 include RF input terminal 353, an input matching network 354, a driver transistor 355, an interstage matching network 356, an output transistor 357, and an RF output terminal 358. According to an embodiment, the RF input terminal 353 is configured to enable an array or plurality of wirebonds 366 to be coupled in parallel with each other to the RF input terminal 353 so that the wirebonds 366 extend in a direction (e.g., direction 350) that is parallel with the direction of the signal path through the carrier amplifier die 352 (e.g., direction 350). More specifically, the RF input terminal 353 includes an elongated, conductive pad 353 that is proximate to the first side 701 of the amplifier die 352, and that has a length that extends in parallel with the first side 701 of the amplifier die 352. According to an embodiment, the length of the pad 353 is large enough to enable a plurality of wirebonds (e.g., from 2 to 10 or more) to be connected in parallel with each other along the length of the pad 353. As shown in FIG. 7, the length of the pad 353 is large enough to enable the plurality of wirebonds 366 to be connected so that they can extend in a perpendicular direction from side 701.

The driver and output transistors 355, 357 are coupled in series between the input and output terminals 353, 358. Transistors 355, 357 may be substantially similar to transistors 335, 337 described in conjunction with FIGS. 5 and 6, and the similar details are not repeated here for the purpose of brevity. Suffice it to say that each of transistors 355, 357 includes interdigitated source and drain fingers (i.e., elongated source regions 830 and drain regions 840 in and proximate to the top surface of the substrate 810), with gate terminals 740, 742 (control terminals) overlying the substrate 810 and interdigitated with the source and drain fingers. Drain terminals 744, 746 (current conducting terminals) also overlie the substrate 810 to convey current from the drain regions (i.e., the doped regions 840 at the surface of the semiconductor substrate 810 that together function as drains of the transistors 355, 357). The transistors 355, 357 may have structures other than the interdigitated finger structures discussed herein and illustrated in FIG. 7.

The input terminal 353 of die 352 is electrically coupled to the gate terminal 740 of transistor 355 through input matching network 354, and the drain terminal 744 of transistor 355 is electrically coupled to the gate terminal 742 of transistor 357 through inter-stage matching network 356. According to an embodiment, the drain terminal 746 of transistor 357 is electrically coupled to output terminal 358. Accordingly, the signal path through the carrier amplifier die 352 is in a direction extending from the first side 701 toward the second side 702, or from the RF input terminal 353 toward the RF output terminal 358, which direction is indicated by arrow 350.

According to an embodiment, the RF output terminal 358 is uniquely configured to enable multiple arrays or pluralities of wirebonds 363, 365 to be coupled to the RF output terminal 358 so that the wirebonds 363, 365 extend opposite directions (e.g., direction 330 and a direction that is 180 degrees different from direction 330), where the directions in which wirebonds 363, 365 extend both are significantly different from (e.g., perpendicular to) the direction of the signal path through the peaking amplifier die 352 (e.g., direction 350). More specifically, the RF output terminal 358 includes an elongated, conductive first side pad 738 that is proximate to the third side 703 of the amplifier die 352, a conductive output pad 739 that is proximate to the second side 702 of the amplifier die 352, and a conductive second side pad 740 that is proximate to the fourth side 704 of the amplifier die 352.

The first and second side pads 738, 740 each have a length 750 that extends in parallel with the third side 703 or fourth side 704, respectively, of the amplifier die 352. According to an embodiment, the length 750 of each of the side pads 738, 740 is large enough to enable a plurality of wirebonds (e.g., from 2 to 10 or more) to be connected in parallel with each other along the length of the first side pad 738 and along the length of the second side pad 740. As shown in FIG. 7, the lengths 750 of the side pads 738, 740 are large enough to enable the plurality of wirebonds 363, 365 to be connected so that they can extend in perpendicular directions from sides 703, 704, respectively.

FIG. 7 shows three wirebonds 363 connected in parallel with each other to side pad 738, and three wirebonds 365 connected in parallel with each other to side pad 740. In alternate embodiments, the lengths 750 may be sufficient to enable fewer (e.g., as few as two) or more (e.g., 10 or more) wirebonds to be connected in parallel along the lengths 750 of the side pads 738, 740. For example, the lengths 750 may be in a range of about 200 microns to about 400 microns, although the lengths may be smaller or larger, as well. Side pads 738, 740 each also has a width 752 that is sufficient to enable at least one row of wirebonds 363, 365 to be coupled to each of the side pads 738, 740. For example, the widths 752 may be in a range of about 100 microns to about 150 microns, although the widths may be smaller or larger, as well.

In addition to the side pads 738, 740, the RF output terminal 358 may include an elongated output pad 739, which is electrically coupled to the elongated side pads 738, 740. More specifically, a first end of output pad 739 is electrically coupled to the first side pad 738, and a second end of output pad 739 is electrically coupled to the second side pad 740. The elongated output pad 739 is proximate to the second side 702 of the amplifier die 352, in an embodiment, and the elongated output pad 739 has a length 754 that extends in parallel with the second side 702. According to an embodiment, the side pads 738, 740 and the output pad 739 have lengths 750, 754 that are perpendicular to each other. The length 754 of the output pad 739 is large enough to enable a third plurality of wirebonds 364 to be connected in parallel along the length 754 of the output pad 739. As shown in FIG. 7, the length 754 of the output pad 739 is large enough to enable the plurality of wirebonds 364 to be connected so that they can extend in a perpendicular direction from side 702. FIG. 7 shows eight wirebonds 364 connected in parallel with each other. In alternate embodiments, the length 754 may be sufficient to enable more (e.g., 20 or more) wirebonds to be connected in parallel along the length 754 of the output pad 739. According to an embodiment, the length 754 may be in a range of about 800 microns to about 1800 microns, or more desirably in a range of about 1500 microns to about 1800 microns, although the length may be smaller or larger, as well.

In an embodiment, the side pads 738, 740 and output pad 739 are integrally formed together as a portion of a same conductive layer 821. In alternate embodiments, the side pads 738, 740 and output pad 739 may be formed from different portions of a single conductive layer, and electrically connected together through conductive vias, portions of other conductive layers, wirebonds, or other types of electrical conductors. Alternatively, the side pads 738, 740 and output pad 739 may be formed from electrically connected portions of multiple conductive layers.

Figure 9:
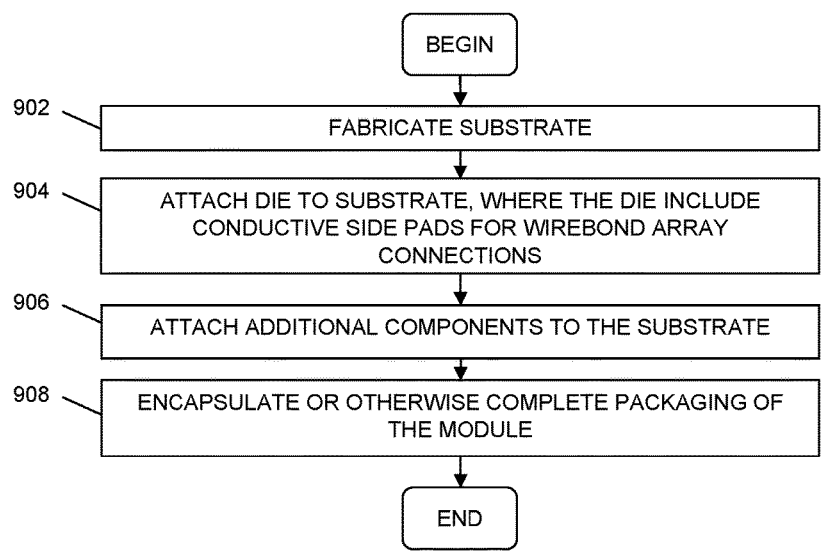
FIG. 9 is a flowchart of a method for fabricating a Doherty amplifier module, in accordance with an example embodiment.

FIG. 9 is a flowchart of a method for fabricating a Doherty amplifier module (e.g., Doherty amplifier module 300, FIG. 3), in accordance with an example embodiment. The method begins, in block 902, by fabricating a substrate (e.g., substrate 310, FIG. 3), which includes a plurality of conductive features (e.g., landing pads, contacts, conductive traces, and conductive vias) arranged to provide desired electrical connectivity to subsequently attached discrete die and components. As discussed previously, a plurality of non-overlapping zones (e.g., zones 301-305, FIG. 3) may be defined at the mounting surface (e.g., surface 312, FIG. 3) of the substrate. Within die mounting zones (e.g., zones 302, 303, FIG. 3), the substrate may include conductive heat-sink features (e.g., conductive trenches 480, FIG. 4). In addition, in an embodiment, the substrate may include one or more transmission lines (e.g., transmission lines 372, FIG. 3), which are configured to impart desired phase shifts to signals traveling through the transmission lines.

In block 904, first and second amplifier die (e.g., carrier and peaking amplifier die 332, 352, FIG. 3) are attached to the mounting surface of the substrate in the die mounting zones. As discussed previously, the first and second amplifier die are attached so that RF signal paths through the die are oriented in substantially different directions (or angularly separated). For example, the first and second amplifier die may be attached to the substrate so that the die, and the RF signal paths through the die, are substantially perpendicular to each other. As described in detail above, the amplifier die may include output terminals (e.g., terminals 338, 358, FIG. 3) that are configured to enable wirebond arrays (e.g., wirebond arrays 361, 363, 365) to be coupled to the die so that the wirebond arrays extend perpendicular to the signal directions (e.g., directions 330, 350) through the dies, in various embodiments.

In block 906, additional discrete components are attached to the mounting surface of the substrate, and the various components are electrically connected together with wirebonds (e.g., including wirebonds 360-366, FIG. 3) and/or other conductive coupling means. Finally, in block 908, the various die and components overlying the mounting surface of the substrate are encapsulated (e.g., with encapsulant material 430, FIG. 4), or otherwise contained (e.g., in an air cavity package configuration) to complete the module.

An embodiment of a monolithic power transistor IC includes a semiconductor die, one or more first transistors, an input terminal, and an output terminal. The semiconductor die has a top surface, a bottom surface, parallel first and second sides extending between the top and bottom surfaces, and parallel third and fourth sides extending between the first and second sides and between the top and bottom surfaces. The one or more transistors are integrated within the semiconductor die, and the one or more transistors include a control terminal and a current conducting terminal. The input terminal is electrically coupled to the control terminal of the one or more transistors. The output terminal is electrically coupled to the current conducting terminal of the one or more transistors. A direction of a signal path through the power transistor IC extends from the first side of the semiconductor die toward the second side, the output terminal has an elongated first pad that is proximate to the third side of the semiconductor die, the elongated first pad has a first length that extends in parallel with the third side of the semiconductor die, and the first length is large enough to enable a first plurality of wirebonds to be connected in parallel along the first length of the elongated first pad.

An amplifier module (e.g., a Doherty amplifier module) includes a substrate with a mounting surface and a first monolithic power transistor coupled to the mounting surface. The first monolithic power transistor includes a first semiconductor die, one or more first transistors, a first input terminal, and a first output terminal. The semiconductor die has a top surface, a bottom surface, parallel first and second sides extending between the top and bottom surfaces, and parallel third and fourth sides extending between the first and second sides and between the top and bottom surfaces. The one or more first transistors are integrated within the first semiconductor die, and the one or more first transistors include a control terminal and a current conducting terminal. The first input terminal is electrically coupled to the control terminal of the one or more first transistors. The first output terminal is electrically coupled to the current conducting terminal of the one or more first transistors. A direction of a signal path through the first semiconductor die extends from the first side of the first semiconductor die toward the second side, the first output terminal has an elongated first pad that is proximate to the third side of the first semiconductor die, the elongated first pad has a first length that extends in parallel with the third side of the first semiconductor die, and the first length is large enough to enable a first plurality of wirebonds to be connected in parallel along the first length of the elongated first pad.

According to a further embodiment, the amplifier module further includes a second monolithic power transistor coupled to the mounting surface. The second monolithic power transistor includes a second semiconductor die, one or more second transistors, a second input terminal, and a second output terminal. The second semiconductor die has a top surface, a bottom surface, parallel first and second sides extending between the top and bottom surfaces, and parallel third and fourth sides extending between the first and second sides and between the top and bottom surfaces. The one or more second transistors are integrated within the second semiconductor die, and the one or more second transistors include a control terminal and a current conducting terminal. The second input terminal is electrically coupled to the control terminal of the one or more second transistors. The second output terminal is electrically coupled to the current conducting terminal of the one or more second transistors. A direction of a signal path through the second semiconductor die extends from the first side of the second semiconductor die toward the second side, the second output terminal has an elongated second pad that is proximate to the third side of the second semiconductor die, the elongated second pad has a second length that extends in parallel with the third side of the second semiconductor die, and the second length is large enough to enable a second plurality of wirebonds to be connected in parallel along the third length of the elongated second pad. The amplifier module further includes a first conductive component exposed at the mounting surface of the substrate. The elongated first pad of the first output terminal is electrically coupled to a first end of the first conductive component, and the elongated second pad of the second output terminal is electrically coupled to a second end of the first conductive component.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A monolithic power transistor integrated circuit (IC) comprising:
   a semiconductor die having a top surface, a bottom surface, parallel first and second sides extending between the top and bottom surfaces, and parallel third and fourth sides extending between the first and second sides and between the top and bottom surfaces;
   a transistor integrated within the semiconductor die, wherein the transistor includes a control terminal and a current conducting terminal;
   an input terminal electrically coupled to the control terminal of the transistor; and
   an output terminal electrically coupled to the current conducting terminal of the transistor, wherein a direction of a signal path through the power transistor IC extends from the first side of the semiconductor die toward the second side, the output terminal has an elongated first pad that is proximate to the third side of the semiconductor die, the elongated first pad has a first length that extends in parallel with the third side of the semiconductor die, the elongated first pad is positioned between the transistor and the third side of the semiconductor die, and the elongated first pad is configured to enable a first plurality of wirebonds to be connected in parallel along the first length of the elongated first pad.

2. The power transistor IC of claim 1, wherein:
   the first length is in a range between 200 microns and 400 microns.

3. A monolithic power transistor integrated circuit (IC) comprising:
   a semiconductor die having a top surface, a bottom surface, parallel first and second sides extending between the top and bottom surfaces, and parallel third and fourth sides extending between the first and second sides and between the top and bottom surfaces;
   one or more transistors integrated within the semiconductor die, wherein the one or more transistors include a control terminal and a current conducting terminal;
   an input terminal electrically coupled to the control terminal of the one or more transistors; and
   an output terminal electrically coupled to the current conducting terminal of the one or more transistors, wherein a direction of a signal path through the power transistor IC extends from the first side of the semiconductor die toward the second side, and the output terminal includes
      an elongated first pad that is proximate to the third side of the semiconductor die, the elongated first pad has a first length that extends in parallel with the third side of the semiconductor die, and the elongated first pad is configured to enable a first plurality of wirebonds to be connected in parallel along the first length of the elongated first pad, and
      an elongated second pad that is electrically coupled to the elongated first pad, wherein the elongated second pad is proximate to the second side of the semiconductor die, and the elongated second pad has a second length that extends in parallel with the second side of the semiconductor die, and the elongated second pad is configured to enable a second plurality of wirebonds to be connected in parallel along the second length of the elongated second pad.

4. The power transistor IC of claim 3, wherein:

the first length is configured to enable the first plurality of wirebonds to be connected in parallel along the first length of the elongated first pad so that the each of the wirebonds in the first plurality of wirebonds extend in a perpendicular direction from the third side of the semiconductor die; and the second length is configured to enable the second plurality of wirebonds to be connected in parallel along the second length of the elongated second pad so that the each of the wirebonds in the second plurality of wirebonds extend in a perpendicular direction from the second side of the semiconductor die.

5. The power transistor IC of claim 3, wherein:

the first length is in a range between 200 microns and 400 microns; and the second length is in a range between 800 microns and 1800 microns.

6. The power transistor IC of claim 3, wherein the output terminal further comprises:

an elongated third pad that is electrically coupled to the elongated first pad and to the elongated second pad, wherein the elongated third pad is proximate to the fourth side of the semiconductor die, the elongated third pad has a third length that extends in parallel with the fourth side of the semiconductor die, and the elongated third pad is configured to enable a third plurality of wirebonds to be connected in parallel along the third length of the elongated third pad.

7. The power transistor IC of claim 6, wherein:

the first length is configured to enable the first plurality of wirebonds to be connected in parallel along the first length of the elongated first pad so that the each of the wirebonds in the first plurality of wirebonds extend in a perpendicular direction from the third side of the semiconductor die;

the second length is configured to enable the second plurality of wirebonds to be connected in parallel along the second length of the elongated second pad so that the each of the wirebonds in the second plurality of wirebonds extend in a perpendicular direction from the second side of the semiconductor die; and the third length is configured to enable the third plurality of wirebonds to be connected in parallel along the third length of the elongated third pad so that the each of the wirebonds in the third plurality of wirebonds extend in a perpendicular direction from the fourth side of the semiconductor die.

8. A monolithic power transistor integrated circuit (IC) comprising:

a semiconductor die that includes
  a top surface,
  a bottom surface,
  parallel first and second sides extending between the top and bottom surfaces,
  parallel third and fourth sides extending between the first and second sides and between the top and bottom surfaces,
  a semiconductor substrate with a top surface and a bottom surface, wherein the bottom surface of the semiconductor substrate defines the bottom surface of the semiconductor die, and a plurality of patterned conductive layers formed over the top surface of the semiconductor substrate;

one or more transistors integrated within the semiconductor die, wherein the one or more transistors include a control terminal and a current conducting terminal, and wherein the current conducting terminal is coupled to a doped semiconductor region proximate to the top surface of the semiconductor substrate;

an input terminal electrically coupled to the control terminal of the one or more transistors; and an output terminal electrically coupled to the current conducting terminal of the one or more transistors, wherein a direction of a signal path through the power transistor IC extends from the first side of the semiconductor die toward the second side, the output terminal has an elongated first pad that is proximate to the third side of the semiconductor die, the elongated first pad has a first length that extends in parallel with the third side of the semiconductor die, the elongated first pad is configured to enable a first plurality of wirebonds to be connected in parallel along the first length of the elongated first pad, and the elongated first pad is formed from a portion of a patterned conductive layer that is closest to the top surface of the semiconductor die.

9. The power transistor IC of claim 1, wherein the semiconductor die comprises:

a semiconductor substrate with a top surface and a bottom surface, wherein the bottom surface of the semiconductor substrate defines the bottom surface of the semiconductor die, and the current conducting terminal includes a doped semiconductor region proximate to the top surface of the semiconductor substrate; and a plurality of patterned conductive layers formed over the top surface of the semiconductor substrate, wherein the input terminal and the output terminal are formed from portions of one or more patterned conductive layers that are exposed at the top surface of the semiconductor die, and wherein the input terminal has an elongated second pad that is proximate to the first side of the semiconductor die, the elongated second pad has a second length that extends in parallel with the first side of the semiconductor die, and the second pad is configured to enable a second plurality of wirebonds to be connected in parallel along the second length of the elongated second pad.

10. An amplifier module comprising:

a substrate with a mounting surface;

a first monolithic power transistor coupled to the mounting surface, wherein the first monolithic power transistor includes
  a first semiconductor die having a top surface, a bottom surface, parallel first and second sides extending between the top and bottom surfaces, and parallel third and fourth sides extending between the first and second sides and between the top and bottom surfaces,
  a transistor integrated within the first semiconductor die, wherein the transistor includes a control terminal and a current conducting terminal,
  a first input terminal electrically coupled to the control terminal of the transistor, and
  a first output terminal electrically coupled to the current conducting terminal of the transistor, wherein a direction of a signal path through the first semiconductor die extends from the first side of the first semiconductor die toward the second side, the first output terminal has an elongated first pad that is proximate to the third side of the first semiconductor die, the elongated first pad has a first length that extends in parallel with the third side of the first semiconductor die, the elongated first pad is positioned between the transistor and the third side of the semiconductor die, and the elongated first pad is configured to enable a first plurality of wirebonds to be connected in parallel along the first length of the elongated first pad.

11. An amplifier module comprising:

a substrate with a mounting surface;

a first monolithic power transistor coupled to the mounting surface, wherein the first monolithic power transistor includes a first semiconductor die having a top surface, a bottom surface, parallel first and second sides extending between the top and bottom surfaces, and parallel third and fourth sides extending between the first and second sides and between the top and bottom surfaces, one or more first transistors integrated within the first semiconductor die, wherein the one or more first transistors include a control terminal and a current conducting terminal, a first input terminal electrically coupled to the control terminal of the one or more first transistors, and a first output terminal electrically coupled to the current conducting terminal of the one or more first transistors, wherein a direction of a signal path through the first semiconductor die extends from the first side of the first semiconductor die toward the second side, and the first output terminal includes an elongated first pad that is proximate to the third side of the first semiconductor die, the elongated first pad has a first length that extends in parallel with the third side of the first semiconductor die, and the elongated first pad is configured to enable a first plurality of wirebonds to be connected in parallel along the first length of the elongated first pad, and an elongated second pad that is electrically coupled to the elongated first pad, wherein the elongated second pad is proximate to the second side of the first semiconductor die, and the elongated second pad has a second length that extends in parallel with the second side of the first semiconductor die, and the elongated second pad is configured to enable a second plurality of wirebonds to be connected in parallel along the second length of the elongated second pad;

first and second conductive components exposed at the mounting surface of the substrate;

a first wirebond array that includes the first plurality of wirebonds coupled between the elongated first pad of the first output terminal and the first conductive component, wherein the first wirebond array is configured to convey an amplified first RF signal; and a second wirebond array coupled between the elongated second portion of the first output terminal and the second conductive component, wherein the first and second wirebond arrays are oriented in substantially different directions from each other.

12. The amplifier module of claim 11, wherein the first and second wirebond arrays are oriented perpendicularly to each other.

13. The amplifier module of claim 11, wherein the one or more first power transistors are configured to produce an amplified first RF signal at the first output terminal, the second wirebond array is configured to receive an amplified second RF signal, and the first output terminal functions as a combining node at which the amplified first and second RF signals are combined to produce an amplified third RF signal that is conveyed by the second wirebond array to the second conductive component.

14. An amplifier module comprising:

a substrate with a mounting surface;

a first monolithic power transistor coupled to the mounting surface, wherein the first monolithic power transistor includes a first semiconductor die having a top surface, a bottom surface, parallel first and second sides extending between the top and bottom surfaces, and parallel third and fourth sides extending between the first and second sides and between the top and bottom surfaces, one or more first transistors integrated within the first semiconductor die, wherein the one or more first transistors include a control terminal and a current conducting terminal, a first input terminal electrically coupled to the control terminal of the one or more first transistors, and a first output terminal electrically coupled to the current conducting terminal of the one or more first transistors, wherein a direction of a signal path through the first semiconductor die extends from the first side of the first semiconductor die toward the second side, the first output terminal has an elongated first pad that is proximate to the third side of the first semiconductor die, the elongated first pad has a first length that extends in parallel with the third side of the first semiconductor die, and the elongated first pad is configured to enable a first plurality of wirebonds to be connected in parallel along the first length of the elongated first pad;

a second monolithic power transistor coupled to the mounting surface, wherein the second monolithic power transistor includes a second semiconductor die having a top surface, a bottom surface, parallel first and second sides extending between the top and bottom surfaces, and parallel third and fourth sides extending between the first and second sides and between the top and bottom surfaces, one or more second transistors integrated within the second semiconductor die, wherein the one or more second transistors include a control terminal and a current conducting terminal, a second input terminal electrically coupled to the control terminal of the one or more second transistors, and a second output terminal electrically coupled to the current conducting terminal of the one or more second transistors, wherein a direction of a signal path through the second semiconductor die extends from the first side of the second semiconductor die toward the second side of the second semiconductor die, the second output terminal has an elongated second pad that is proximate to the third side of the second semiconductor die, the elongated second pad has a second length that extends in parallel with the third side of the second semiconductor die, and the elongated second pad is configured to enable a second plurality of wirebonds to be connected in parallel along the second length of the elongated second pad; and a first conductive component exposed at the mounting surface of the substrate, wherein the elongated first pad of the first output terminal is electrically coupled to a first end of the first conductive component, and the elongated second pad of the second output terminal is electrically coupled to a second end of the first conductive component.

15. The amplifier module of claim 14, wherein the first conductive component has an electrical length between the first and second ends of the first conductive component that is sufficient to impart a delay of at least 90 degrees to an RF signal carried by the first conductive component.

16. The amplifier module of claim 14, further comprising:
a first wirebond array including the first plurality of wirebonds coupled between the elongated first pad of the first output terminal and the first end of the first conductive component; and
a second wirebond array including the second plurality of wirebonds coupled between the elongated second pad of the second output terminal and the second end of the first conductive component, wherein the first and second wirebond arrays are perpendicular to each other.

17. The amplifier module of claim 16, wherein the first output terminal further comprises:
an elongated third pad that is electrically coupled to the elongated first pad, wherein the elongated third pad is proximate to the second side of the first semiconductor die, and the elongated third pad has a third length that extends in parallel with the second side of the first semiconductor die, and the elongated third pad is configured to enable a third plurality of wirebonds to be connected in parallel along the third length of the elongated third pad; and
wherein the amplifier module further comprises
a second conductive component exposed at the mounting surface of the substrate; and
a third wirebond array including the third plurality of wirebonds coupled between the elongated third pad of the first output terminal and the second conductive component, wherein the first and third wirebond arrays are perpendicular to each other.

18. The amplifier module of claim 14, wherein the first monolithic power transistor is a first amplifier of a Doherty power amplifier, and the second monolithic power transistor is a second amplifier of a Doherty power amplifier, the amplifier module further comprising:
an RF signal splitter coupled to the substrate, wherein the RF signal splitter is configured to receive and divide an input RF signal into a first input RF signal and a second input RF signal, and to convey the first and second input RF signals to first and second splitter output terminals, and wherein
the first monolithic power transistor is configured to amplify the first input RF signal to produce an amplified first RF signal,
the second monolithic power transistor is configured to amplify the second input RF signal to produce an amplified second RF signal,
the first conductive component has an electrical length between the first and second ends of the first conductive component that is sufficient to impart a delay to the amplified second RF signal between the second and first ends of the first conductive component, and the first output terminal functions as a combining node at which the amplified first and second RF signals are combined to produce an amplified third RF signal.

19. A Doherty amplifier module comprising:
a substrate;
a first conductive component coupled to the substrate, wherein the first conductive component has a first end and a second end;
a first plurality of wirebonds coupled to the first end of the first conductive component;
a second plurality of wirebonds coupled to the second end of the first conductive component;
a first amplifier die coupled to the substrate, wherein the first amplifier die includes
one or more first transistors integrated within the first amplifier die, wherein the one or more first transistors include a current conducting terminal, and
a first output terminal electrically coupled to the current conducting terminal of the one or more first transistors, wherein a first direction of a first signal path through the first amplifier die extends from a first side of the first amplifier die toward a parallel second side of the first amplifier die, the first output terminal has an elongated first pad that is proximate to the third side of the first amplifier die, the elongated first pad has a first length that extends in parallel with the third side of the first amplifier die, and the elongated first pad is configured to enable the first plurality of wirebonds to be connected in parallel along the first length of the elongated first pad; and
a second amplifier die coupled to the substrate, wherein the second amplifier die includes
one or more second transistors integrated within the second amplifier die, wherein the one or more second transistors include a current conducting terminal, and
a second output terminal electrically coupled to the current conducting terminal of the one or more second transistors, wherein a second direction of a second signal path through the second amplifier die extends from a first side of the second amplifier die toward a parallel second side of the second amplifier die, the second output terminal has an elongated second pad that is proximate to a third side of the second amplifier die, the elongated second pad has a second length that extends in parallel with the third side of the second amplifier die, and the elongated second pad is configured to enable the second plurality of wirebonds to be connected in parallel along the second length of the elongated second pad.

20. The Doherty amplifier module of claim 19, wherein:
the first and second amplifier die are coupled to the substrate so that the first and second directions are perpendicular to each other; and
the first plurality of wirebonds extend in the second direction; and
the second plurality of wirebonds extend in the first direction.

21. The Doherty amplifier module of claim 19, further comprising:
a second conductive component coupled to the substrate; and
a third plurality of wirebonds coupled to the second conductive component, and wherein
the second output terminal further includes an elongated third pad that is proximate to the second side of the second amplifier die, the elongated third pad has a third length that extends in parallel with the second side of the second amplifier die, and the elongated third pad is configured to enable the third plurality of wirebonds to be connected in parallel along the third length of the elongated third pad, the first and second plurality of wirebonds and the first conductive component together have an electrical length that is sufficient to impart a delay of 90 degrees or more on an RF signal carried through the first conductive component, and the second output terminal functions as a combining node for combining an amplified first RF signal produced by the second amplifier die with an amplified second RF signal produced by the first amplifier die and delayed through the first conductive component, and the third plurality of wirebonds and the second conductive component are configured to convey a combination of the amplified first and second RF signals to an output of the Doherty amplifier module.

22. The Doherty amplifier module of claim 19, wherein:
the first amplifier die is a carrier amplifier die; and
the second amplifier die is a peaking amplifier die.

23. The Doherty amplifier module of claim 19, wherein:
the first amplifier die is a peaking amplifier die; and
the second amplifier die is a carrier amplifier die.

24. The power transistor IC of claim 3, wherein the first length is larger than a width of the elongated second pad, and the first length of the elongated first pad is perpendicular to the second length of the elongated second pad.

25. The power transistor IC of claim 6, wherein the first length is larger than a width of the elongated second pad, the third length is larger than the width of the elongated second pad, and the first length of the elongated first pad and the third length of the elongated third pad are perpendicular to the second length of the elongated second pad.

26. The amplifier module of claim 11, wherein the first length is larger than a width of the elongated second pad, and the first length of the elongated first pad is perpendicular to the second length of the elongated second pad.

27. The amplifier module of claim 17, wherein the first length is larger than a width of the elongated third pad, and the first length of the elongated first pad is perpendicular to the third length of the elongated third pad.

28. The Doherty amplifier module of claim 21, wherein the first length is larger than a width of the elongated third pad, and the first length of the elongated first pad is perpendicular to the third length of the elongated third pad.

* * * * *